US012666591B2

(12) United States Patent
Tang

(10) Patent No.: US 12,666,591 B2
(45) Date of Patent: Jun. 23, 2026

(54) METHOD FOR PREPARING SEMICONDUCTOR STRUCTURE, SEMICONDUCTOR STRUCTURE AND SEMICONDUCTOR MEMORY

(71) Applicant: CHANGXIN MEMORY TECHNOLOGIES, INC., Hefei City (CN)

(72) Inventor: Yi Tang, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 607 days.

(21) Appl. No.: 18/155,114

(22) Filed: Jan. 17, 2023

(65) Prior Publication Data

US 2023/0422468 A1 Dec. 28, 2023

Related U.S. Application Data

(63) Continuation of application No. PCT/CN2022/107377, filed on Jul. 22, 2022.

(30) Foreign Application Priority Data

Jun. 24, 2022 (CN) .......................... 202210729004.8

(51) Int. Cl.
*H10B 12/00* (2023.01)
(52) U.S. Cl.
CPC .......... *H10B 12/05* (2023.02); *H10B 12/482* (2023.02); *H10B 12/488* (2023.02)

(58) Field of Classification Search
CPC .... H10B 12/05; H10B 12/482; H10B 12/488; H10B 12/033
See application file for complete search history.

(56) References Cited

U.S. PATENT DOCUMENTS

| | | | |
|---|---|---|---|
| 2010/0200913 A1 | 8/2010 | Masuoka | |
| 2012/0094449 A1 | 4/2012 | Juengling | |
| 2012/0181622 A1 | 7/2012 | Masuoka | |

(Continued)

FOREIGN PATENT DOCUMENTS

| | | |
|---|---|---|
| CN | 101044615 A | 9/2007 |
| CN | 106684089 A | 5/2017 |

(Continued)

*Primary Examiner* — Andres Munoz
(74) *Attorney, Agent, or Firm* — Syncoda; Feng Ma

(57) ABSTRACT

A method for preparing a semiconductor structure, a semiconductor structure and a semiconductor memory are provided. The method includes: a substrate is provided; a stack structure is formed on the substrate; the stack structure is divided into multiple channel areas, first source-drain areas and second source-drain areas. Each channel area extends in a second direction, each first source-drain area and each second source-drain area extend in a first direction, and the first source-drain area and the second source-drain area are located on the same side of the channel area; a first source-drain structure extending in the first direction is formed in the first source-drain area and a second source-drain structure extending in the first direction is formed in the second source-drain area; and a channel structure extending in the second direction is formed in the channel area.

7 Claims, 25 Drawing Sheets

(56)     References Cited

U.S. PATENT DOCUMENTS

2016/0190243 A1*   6/2016  Lee ..................... H10D 30/797
                                                          438/283
2017/0133397 A1    5/2017  Lee
2021/0202488 A1    7/2021  Choi
2022/0278106 A1*   9/2022  Kim ..................... H10D 1/714

FOREIGN PATENT DOCUMENTS

CN          110931429  A     3/2020
CN          110931558  A     3/2020
CN          113130494  A     7/2021
CN          113314422  A     8/2021
CN          114334981  A     4/2022

* cited by examiner

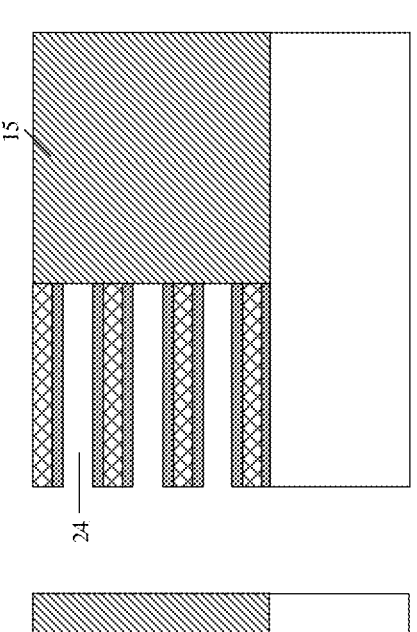
FIG. 15C
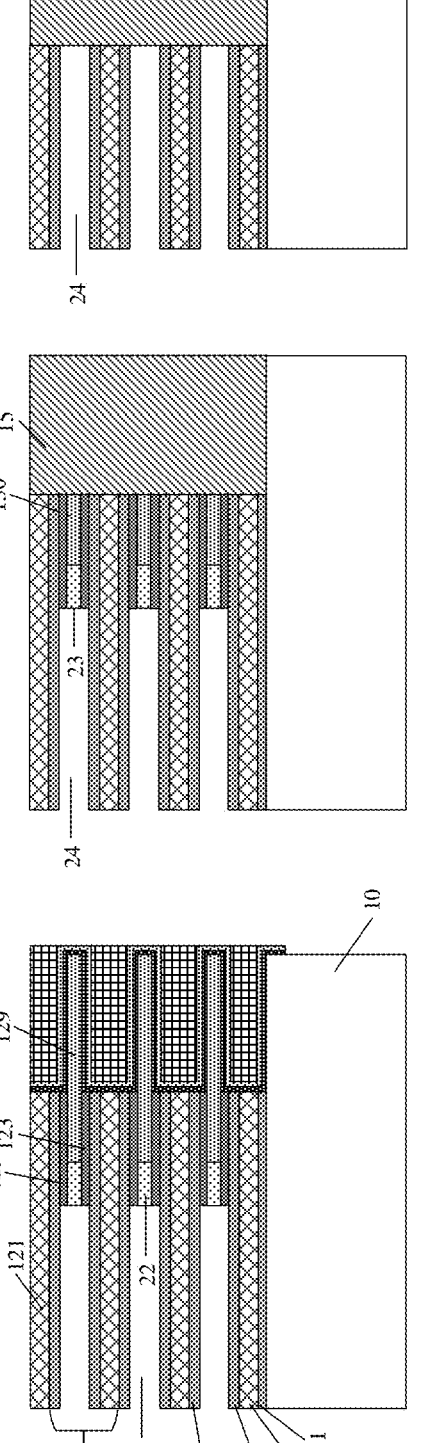
FIG. 15B
FIG. 15A

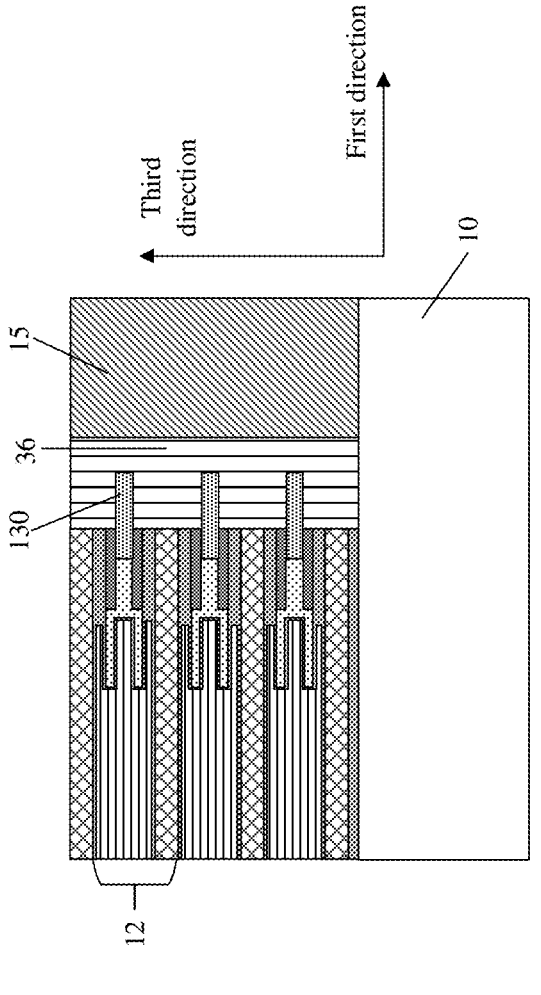
FIG. 24B
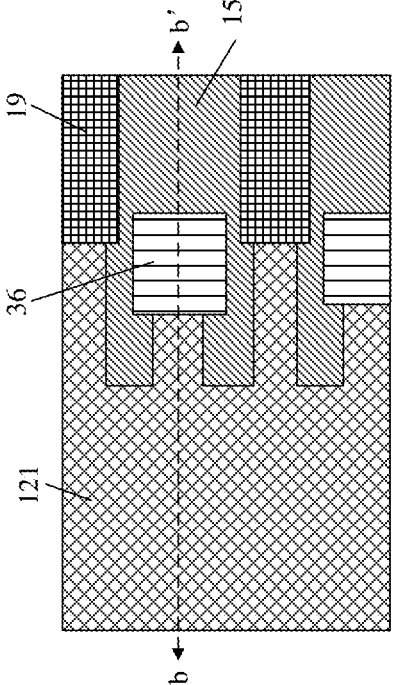
FIG. 24A

Third
direction

Second
direction

First direction

Capacitor

Bit line

Word line

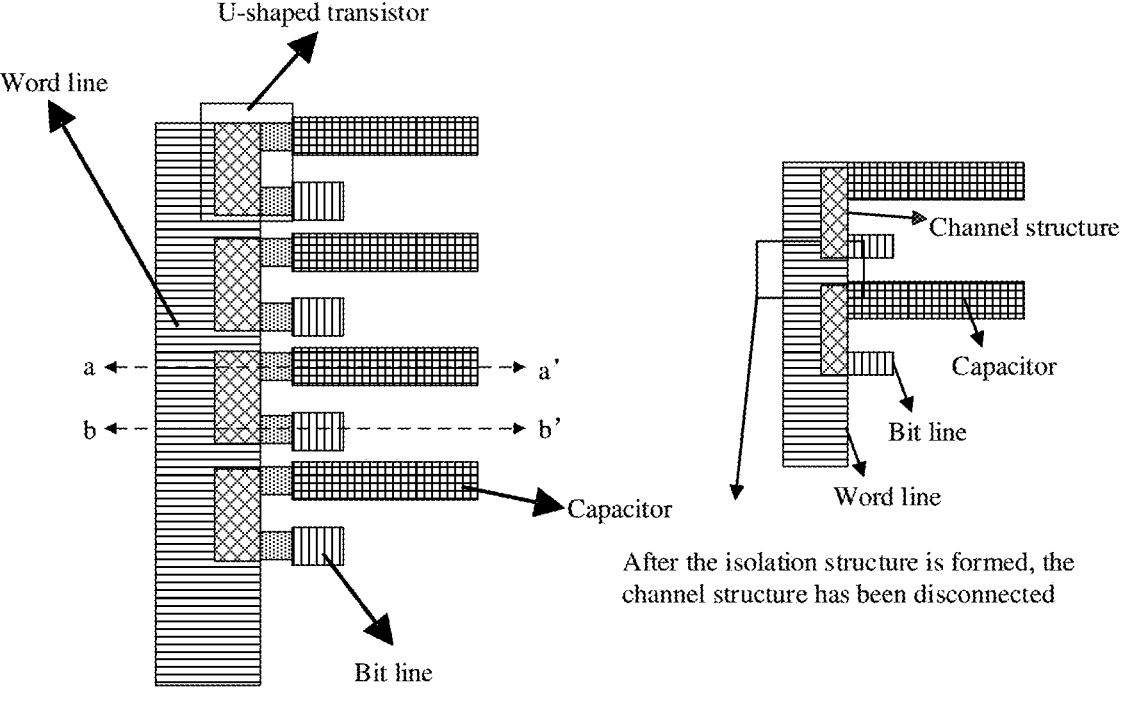
FIG. 29A                    FIG. 29B

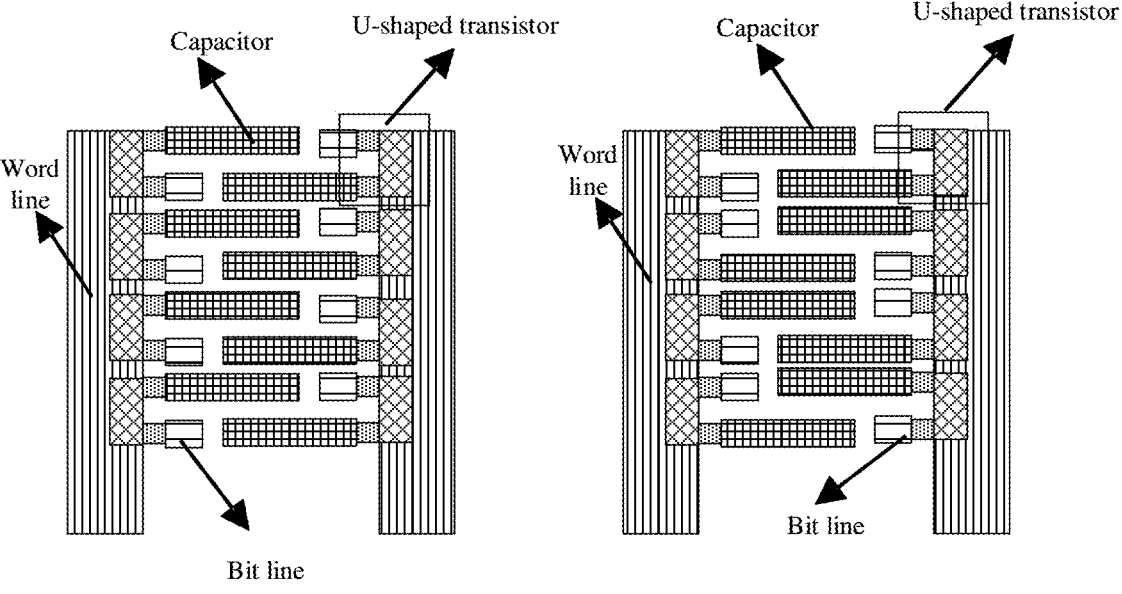
FIG. 30A                    FIG. 30B
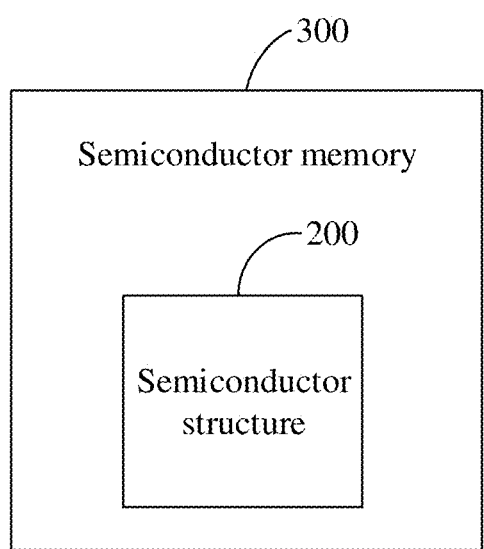
FIG. 31

METHOD FOR PREPARING SEMICONDUCTOR STRUCTURE, SEMICONDUCTOR STRUCTURE AND SEMICONDUCTOR MEMORY

CROSS-REFERENCE TO RELATED APPLICATIONS

The disclosure is a continuation of International Application No. PCT/CN2022/107377, filed on Jul. 22, 2022, which is based upon and claims priority to Chinese Patent Application No. 202210729004.8, filed on Jun. 24, 2022. The contents of International Application No. PCT/CN2022/107377 and Chinese Patent Application No. 202210729004.8 are incorporated herein by reference in their entireties.

BACKGROUND

Transistors are widely used as switching devices or driving apparatuses in semiconductor memories. For example, in a Dynamic Random Access Memory (DRAM), a transistor may be used to control a capacitor of a memory cell. For a semiconductor memory, the pursuit is always for faster speed, lower power consumption, and higher storage density. However, on the premise of reducing the size of a device, keeping the storage capacity of the semiconductor memory small brings many challenges for the design of the semiconductor memory.

SUMMARY

The disclosure relates, but is not limited, to a method for preparing a semiconductor structure, a semiconductor structure, and a semiconductor memory.

A first aspect of the disclosure provides a method for preparing a semiconductor structure. The method includes the following operations.

A substrate is provided.

A stack structure is formed on the substrate.

The stack structure is divided into multiple channel areas, first source-drain areas and second source-drain areas by patterning the stack structure. Each channel area is configured to extend in a second direction, each first source-drain area and each second source-drain area are configured to extend in a first direction, and the first source-drain area and the second source-drain area are located on a same side of the channel area.

A first source-drain structure extending in the first direction is formed in the first source-drain area, and a second source-drain structure extending in the first direction is formed in the second source-drain area.

A channel structure extending in the second direction is formed in the channel area.

A second aspect of the disclosure provides a semiconductor structure, which includes:

a substrate;

a stack structure formed on the substrate, the stack structure includes multiple channel areas, first source-drain areas and second source-drain areas. Each channel area is configured to extend in a second direction, each first source-drain area and each second source-drain area are configured to extend in a first direction, and the first source-drain area and the second source-drain area are located on a same side of the channel area;

a first source-drain structure formed in the first source-drain area and a second source-drain structure formed in the second source-drain area, both the first source-drain structure and the second source-drain structure are configured to extend in the first direction; and a channel structure formed in the channel area, the channel structure are configured to extend in the second direction.

A third aspect of the disclosure provides a semiconductor memory, which includes the semiconductor structure as described in the second aspect.

BRIEF DESCRIPTION OF THE DRAWINGS

FIGS. 15A-15C illustrate schematic diagrams of a structure obtained after forming first source-drain structures and second source-drain structures provided by the embodiments of the disclosure.

FIGS. 24A-24B illustrate schematic diagrams of a structure obtained after forming bit lines provided by the embodiments of the disclosure.

FIGS. 29A-29B illustrate top views of the semiconductor structure provided by the embodiments of the disclosure.

FIGS. 30A-30B illustrate two schematic diagrams of the arrangement of semiconductor arrays provided by the embodiments of the disclosure.

FIG. 31 illustrates a schematic diagram of composition structure of a semiconductor memory provided by the embodiments of the disclosure.

DETAILED DESCRIPTION

Figure 1:
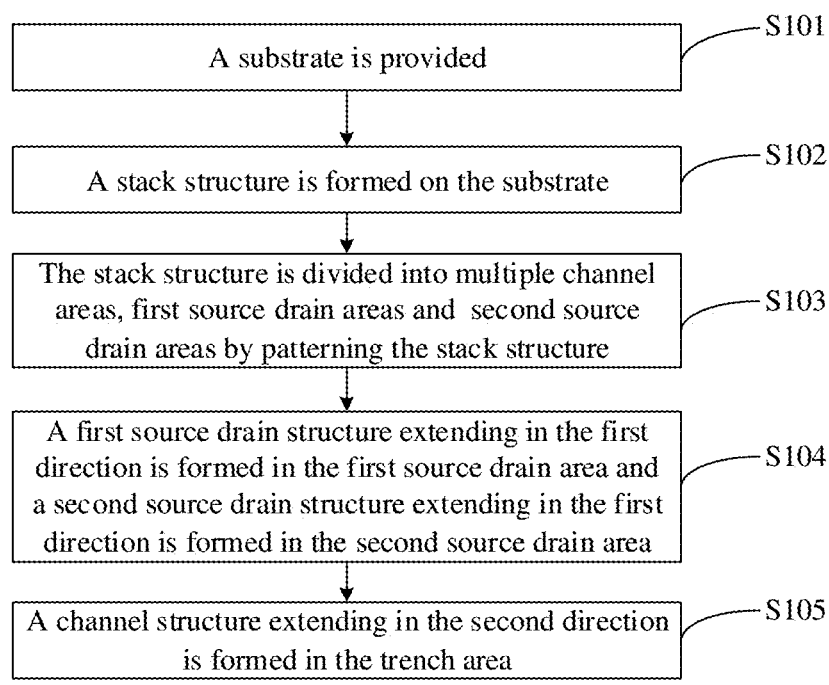
FIG. 1 illustrates a schematic flowchart of a method for preparing a semiconductor structure provided by the embodiments of the disclosure.

Technical solutions in the embodiments of the disclosure are clearly and completely described below in combination with the drawings in the embodiments of the disclosure. It can be understood that the specific embodiments described herein are only illustrative of the disclosure and are not intended to limit the disclosure. In addition, it is further to be noted that, for ease of description, only the parts related to the relevant disclosure are shown in the drawings.

Unless otherwise defined, all technical and scientific terms used herein shall have the same meanings as commonly understood by those skilled in the art to which the disclosure belongs. The terms used herein are only intended to describe the embodiments of the disclosure, and are not intended to limit the disclosure.

"Some embodiments" involved in the following descriptions describe a subset of all possible embodiments. However, it can be understood that "some embodiments" may be the same subset or different subsets of all the possible embodiments, and may be combined without conflicts.

It is to be pointed out that the term "first/second/third" involved in the embodiments of the disclosure is merely for distinguishing similar objects and does not represent a specific sequence of the objects. It can be understood that specific sequences or orders of "first/second/third" may be interchanged if allowed, to implement the embodiments of the disclosure described herein in sequences except the illustrated or described ones.

In the transistor design of a semiconductor memory, a source and a drain of the transistor are usually located on both horizontal sides of a gate. With this structure, the source and the drain occupy different positions respectively, making the transistor array is large in area when forming a transistor array, which is not beneficial to the integration of the semiconductor memory.

Based on this, the embodiments of the disclosure provide a method for preparing a semiconductor structure. The method includes: a substrate is provided; a stack structure is formed on the substrate; the stack structure is divided into multiple channel areas, first source areas, and second source areas, each channel area extends in a second direction, each first source-drain area and each second source-drain area extend in a first direction, and the first source-drain area and the second source-drain area are located on a same side of the channel area; a first source-drain structure extending in the first direction is formed in the first source-drain area and a second source-drain structure extending in the first direction is formed in the second source-drain area; and a channel structure extending in the second direction is formed in the channel area. Thus, in the stacked semiconductor structure, a transistor consists of a channel structure extending along the first direction, and a first source-drain structure and a second source-drain that are located on the same side of the channel structure and both extend in the second direction; which form a transverse U-shaped transistor. Based on this transistor structure, it is conductive to improving the integration degree of the semiconductor structure, and reducing the area of the semiconductor structure.

The various embodiments of the disclosure will be described in detail below in conjunction with the accompanying drawings.

In an embodiment of the disclosure, reference is made to FIG. 1, which illustrates a schematic flowchart of a method for preparing a semiconductor structure provided by the embodiments of the disclosure. As shown in FIG. 1, the method may include the following operations.

At S101, a substrate is provided.

It is to be noted that, the preparation method provided by the embodiments of the disclosure is applied to prepare a semiconductor structure. The semiconductor structure may be a three-dimensional (3D) semiconductor structure, and is mainly applied to a semiconductor memory. When preparing the semiconductor structure, a substrate is first provided. The substrate may be a silicon substrate or other suitable substrate materials such as silicon, germanium, and silicon germanium compounds, for example, a doped or undoped monocrystalline silicon substrate, polysilicon substrate, etc., which are not specifically limited by the embodiments of the disclosure.

S102, a stack structure is formed on the substrate.

It is to be noted that the stack structure is formed on the substrate for preparing the 3D semiconductor structure.

In some embodiments, the operation that the stack structure is formed on the substrate may include the following operations.

A substrate isolation layer is formed on the substrate.

At least one stack layer is formed on the substrate isolation layer.

A support layer is formed on the at least one stack layer.

The operation that the at least one stack layer is formed on the substrate may include the following operations.

Forming one stack layer by following operations. A further support layer is formed on the substrate isolation layer; a first isolation layer is formed on the further support layer; a first protective layer is formed on the first isolation layer; a sacrificial layer is formed on the first protective layer; a second protective layer is formed on the first isolation layer; and a second isolation layer is formed on the second protective layer.

The operations of forming one stack layer are repeated until at least one stack layer is obtained.

Figure 2:
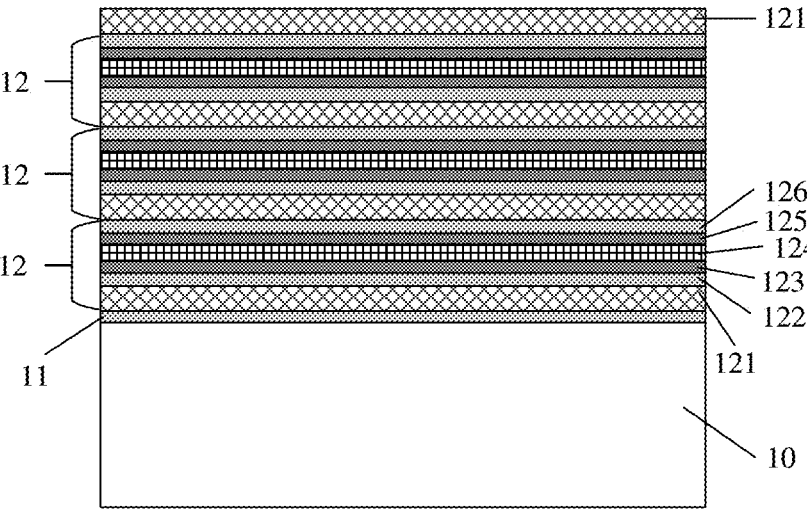
FIG. 2 illustrates a schematic diagram of a structure obtained after forming a stack structure provided by the embodiments of the disclosure.

It is to be noted that FIG. 2 illustrates a schematic diagram of a structure obtained after forming a stack structure. As shown in FIG. 2, when the stack structure is formed, a substrate isolation layer 11 is formed on the substrate 10 first, and then at least one stack layer 12 is formed on the substrate isolation layer 11, and a support layer 121 is formed on the at least one stack layer 12, so as to obtain the stack structure. In the embodiments of the disclosure, the implementation of the method is described by taking three stack layers 12 as shown in FIG. 2 as an example. In actual production, the number of layers of the stack layers 12 may be any number of layers in combination with practice. No specific limits are made thereto in the embodiments of the disclosure.

It is also to be noted that the stack layer 12 may specifically include the support layer 121, a first isolation layer 122, a first protective layer 123, a sacrificial layer 124, a second protective layer 125, and a second isolation layer 126. A method for forming a first stack layer 12 includes that: first, the support layer 121 is formed on the substrate isolation layer 11, then, the first isolation layer 122 is formed on the support layer 121, then, the first protective layer 123 is formed on the first isolation layer 122, then, the sacrificial layer 124 is formed on the first protective layer 123, then, the second protective layer 125 is formed on the sacrificial layer 124, and then the second isolation layer 126 is formed on the second protective layer 125, so as to obtain one stack layer 12. Next, a second stack layer 12 is formed on the first stack layer 12, and the operations are repeated until a required number of layers of stack layers 12 are obtained.

Next, a further support layer 121 is formed on the at least one stack layer 12. Based on this structure, as shown in FIG. 2, protective layers (the first protective layer 123 and the second protective layer 125), isolation layers (the first isolation layer 122 and the second isolation layer 126), and support layers 121 are symmetrically distributed on an upper side and a lower side of each sacrificial layer 124.

The position where the sacrificial layer 124 is located is used for subsequently forming a channel of a transistor, a lower electrode of a capacitor, a word line, etc. The thickness of the sacrificial layer 124 may be 15-25 nm.

Further, in some embodiments, the materials of the substrate isolation, the first isolation layer, the second isolation layer may include silicon dioxide. The material of the support layer may include silicon nitride. The materials of the first protective layer and the second protective layer may include a low dielectric constant (low k) material. The material of the sacrificial layer may include undoped polysilicon.

It is to be noted that, in the embodiments of the disclosure, the stack layer may specifically be a stack layer composed of silicon nitride/silicon dioxide/low k/undoped polysilicon/low k/silicon dioxide (SiN/SiO$_2$/Low K/Un-Doped Poly/Low K/SiO$_2$) arranged from bottom to top. Thus, when forming the stack layer, only a single deposition process is required. In a traditional stack layer, silicon/silicon germanium (Si/GeSi) stack layers are usually formed by epitaxy, which encounters problems of doping and stress during the stacking process, making it more difficult to form multilayer stack layers. By using this stack layer of the embodiments of the disclosure, the problems of doping and stress can be well solved. The process is simple and easy to implement, and a large number of stack layers may also be formed, so as to increase the number of the finally formed one Transistor one Capacitor (1T1C) structures, and obtain a semiconductor structure with higher integration degree, and finally improve the performance of the memory.

It is also to be noted that the undoped polysilicon is used as the sacrificial layer in the embodiments of the disclosure. Thus, subsequent etching of the sacrificial layer is facilitated due to larger etching options among the undoped polysilicon, the first protective layer of a lower layer, and the second protective layer of an upper layer.

At S103, the stack structure is divided into multiple channel areas, first source-drain areas and second source-drain areas by patterning the stack structure.

It is to be noted that the stack structure is patterned after the stack structure is formed, so as to divide the stack structure into the channel areas, the first source-drain areas, and the second source-drain areas. It is to be understood that the stack structure may be divided into multiple channel areas, multiple first source-drain area, and multiple second source-drain areas that are configured to form multiple transistors in each stack layer respectively. The embodiments of the disclosure are described by taking a group of channel areas, first source-drain areas, and second source-drain areas as an example.

In some embodiments, before patterning the stack structure, the method may further include the following operations.

A first groove is formed in the stack layer by removing part of the sacrificial layer.

A first metal layer is formed in the first groove.

The operation that the stack structure is divided into multiple channel areas, first source-drain areas and second source-drain areas by patterning the stack structure may include the following operations.

Multiple dividing trenches are formed in the stack structure by patterning the stack structure and multiple first metal layers. The dividing trenches divide the stack structure into multiple channel areas, first source-drain areas and second source-drain areas. Each dividing trench divides the first metal layer into a first metal pillar and a second metal pillar. Both the first metal pillar and the second metal pillar extend in a first direction.

The stack structure further includes multiple capacitor structures and word line areas. Each capacitor structure extends in the first direction. The capacitor structure is connected to the first source-drain area. Each word line area is located on a side, far away from the capacitor area, of the channel area. The word line area is connected to the channel area.

Figure 3:
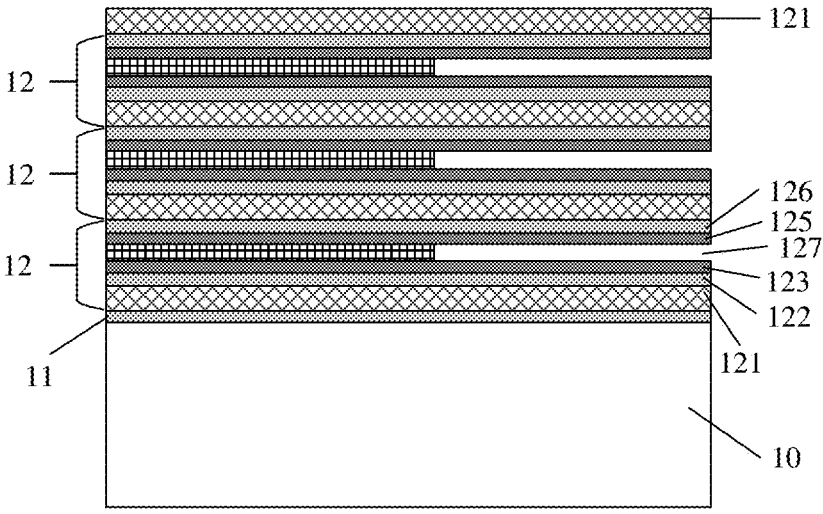
FIG. 3 illustrates a schematic diagram of a structure obtained after removing part of the sacrificial layer provided by the embodiments of the disclosure.

It is to be noted that FIG. 3 illustrates a schematic diagram of a structure obtained after removing part of the sacrificial layer. As shown in FIG. 3, in each stack layer 12, part of the sacrificial layer in the right side is removed to form a first groove 127 in the stack layer 12. The first groove 127 exposes part of the first protective layer 123 and part of the second protective layer 125. The sacrificial layer may be removed by etching.

Figure 4:
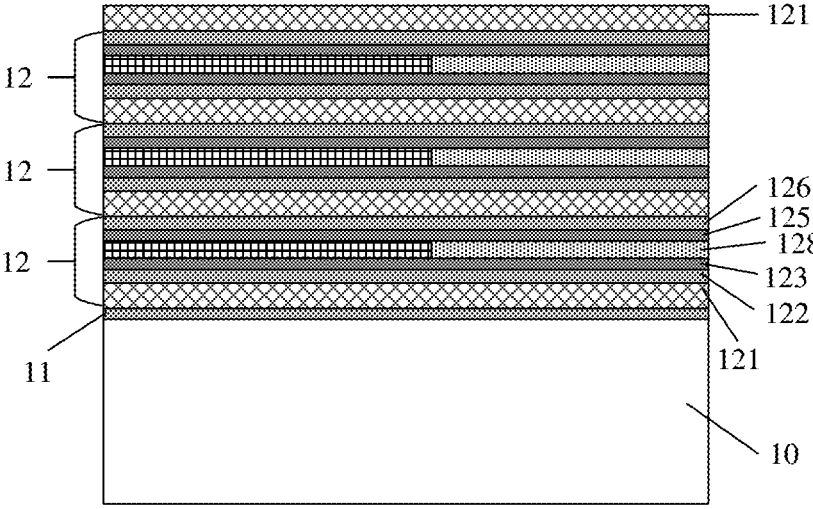
FIG. 4 illustrates a schematic diagram of a structure obtained after forming multiple first metal layers provided by the embodiments of the disclosure.

A first metal layer 128 is formed in the first groove 127. FIG. 4 illustrates a schematic diagram obtained after forming the first metal layer. As shown in FIG. 4, the first metal layer 128 is completely formed in the first groove 127, and the first metal layer 128 may be formed by depositing.

It is to be noted that the material of the first metal layer 128 may include at least one of: titanium (Ti), titanium nitride (TiN), cobalt (Co), molybdenum (Mo), platinum (Pt), palladium (Pd), nickel (Ni), or tungsten (W). The first metal layer 128 is mainly used for forming a lower electrode layer of the capacitor (also referred to as a lower electrode, a lower polar plate, a lower electrode plate, etc.). In addition, the first metal layer 128 which is made of a pure metal material may also be used as a terminal of a transistor, i.e., an electrode (for example, a drain) of a transistor, connected to the capacitor, and the other terminal of the transistor, i.e., an electrode (for example, a source) of the transistor, connected to a bit line.

The stack structure and the first metal layers are patterned simultaneously, so as to divide both the stack structure and the first metal layers. A method for patterning may include that: first, a first mask layer is formed on the stack structure, and the first mask layer has a first pattern for dividing the stack structure and the first metal layers; and then, the first pattern is transferred into the stack structure and the first metal layers, and the first mask layer is removed.

Figures 5A, 5B:
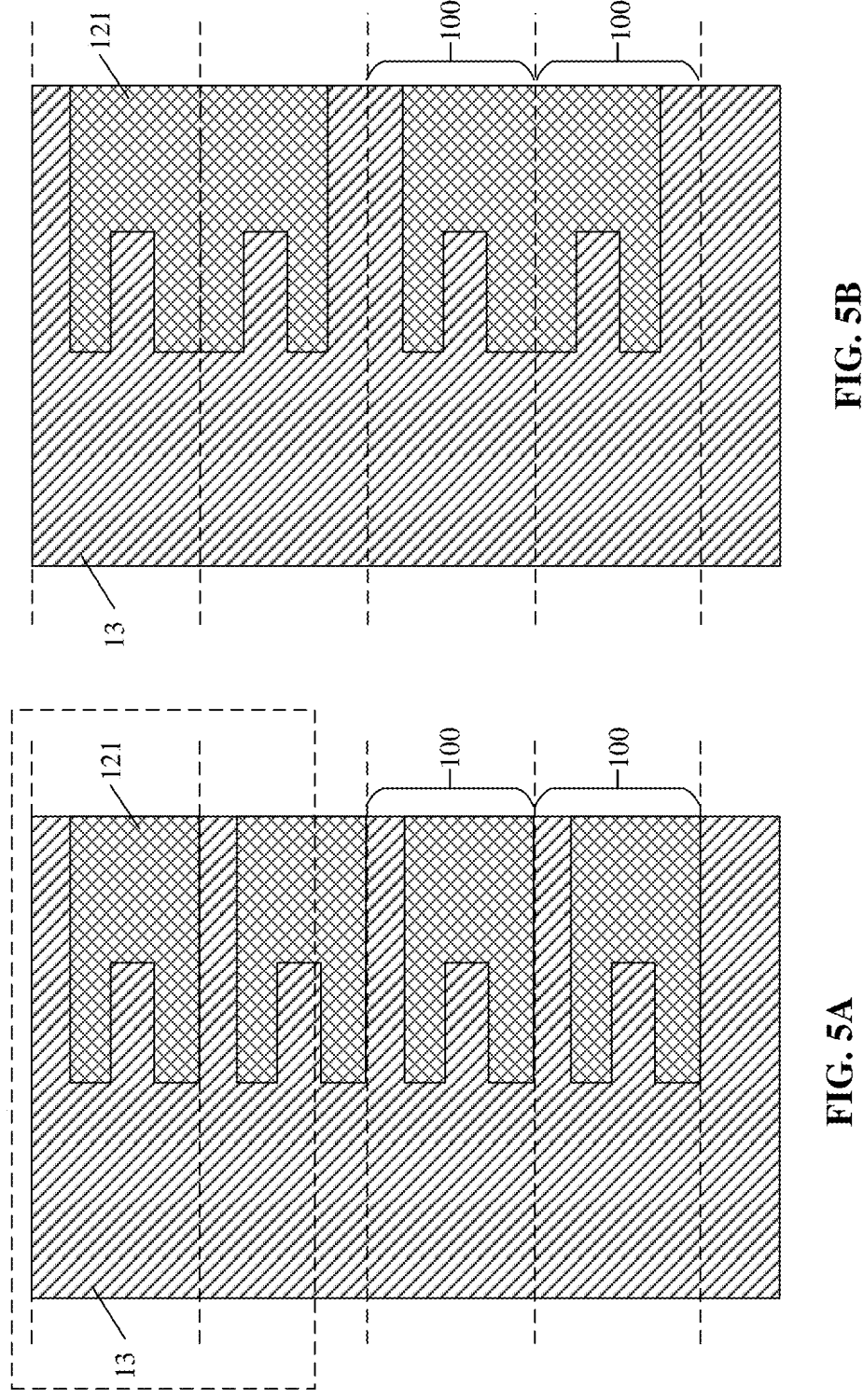
FIGS. 5A and 5B illustrate top views of a structure obtained after forming a first mask layer provided by the embodiments of the disclosure.

Specifically, FIGS. 5A-5B illustrate top views of structures obtained after forming a first mask layer. FIG. 5A and FIG. 5B respectively illustrate two different implementation methods. However, either of the implementation modes may be implemented by dividing into the semiconductor structure units 100 shown between two adjacent dotted lines as shown in FIG. 5, but the layout modes are different. As shown in FIGS. 5A and 5B, a first mask layer 13 may have multiple U-shaped first patterns. The first patterns expose the support layer 121 located below it. In subsequent description, the implementation of the embodiments of the disclosure is described by taking the part of a dotted block as shown in FIGS. 5A and 5B as an example.

Figures 6A, 6B, 6C, 6D:
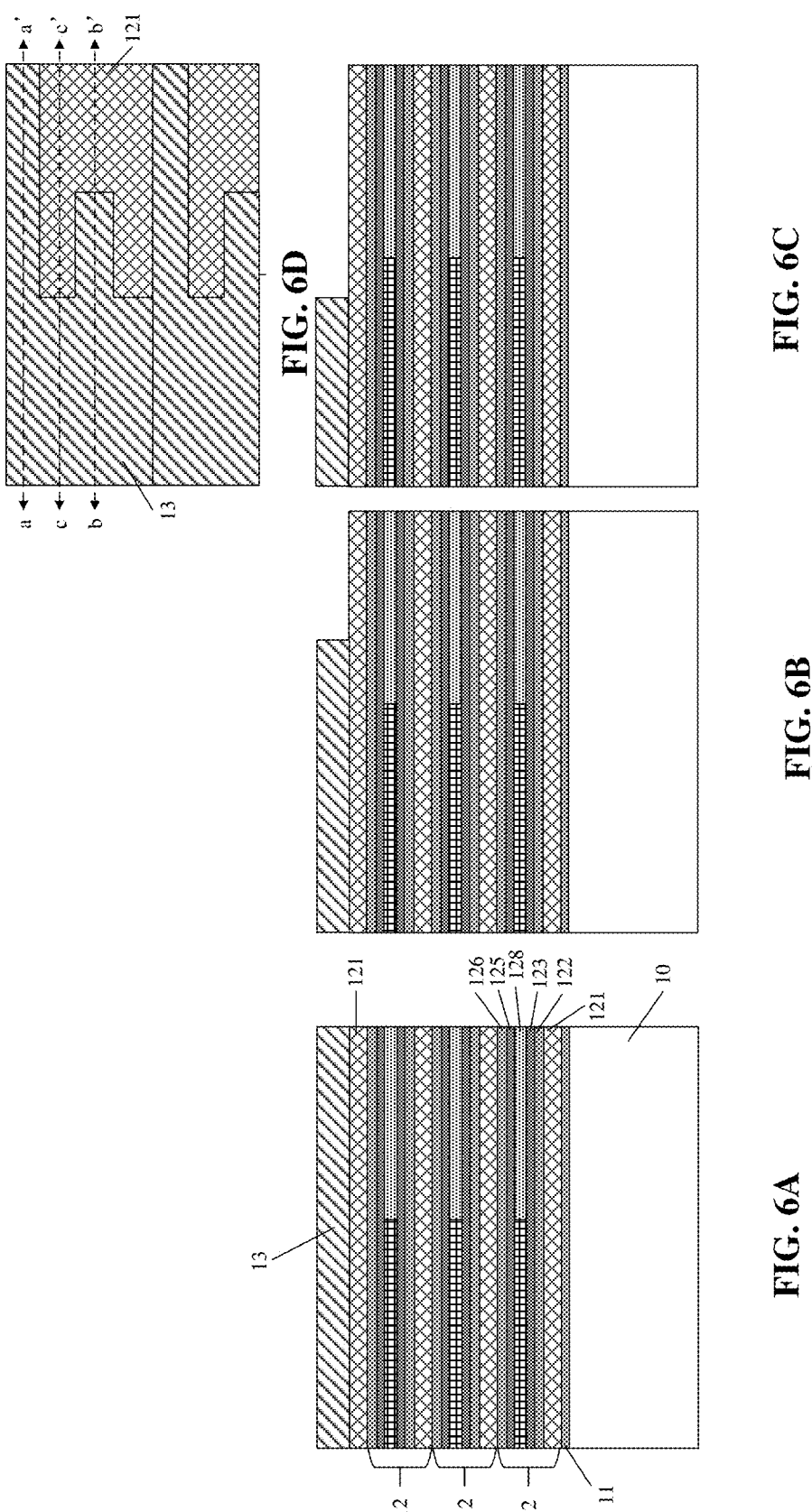
FIGS. 6A-6D illustrate schematic diagrams of a structure obtained after forming the first mask layer provided by the embodiments of the disclosure.

Specifically, FIGS. 6A-6D illustrates a schematic diagram of a structure obtained after forming the first mask layer. FIG. 6D illustrates a top view, which is specifically the part of the dotted block in FIG. 5, FIG. 6A illustrates a sectional view taken along direction aa' in FIG. 6D, FIG. 6B illustrates a sectional view taken along direction bb' in FIG. 6D, and FIG. 6C illustrates a sectional view taken along direction cc' in FIG. 6D. As shown in FIG. 6D, in direction aa', the first mask layer 13 is formed on the isolation structure. In direction bb', the first mask layer 13 is formed in partial area on the isolation structure. In direction cc', the first mask layer 13 is formed in partial area on the isolation structure. The length of the first mask layer 13 formed in the direction bb' is greater than that of the first mask layer 13 formed in the direction cc'. The material of the first mask layer may be photoresist, a single-layer mask, or a composite mask, etc. The first mask layer may be formed by depositing, and the first mask layer may be removed by etching.

Figures 7A, 7B, 7C, 7D:
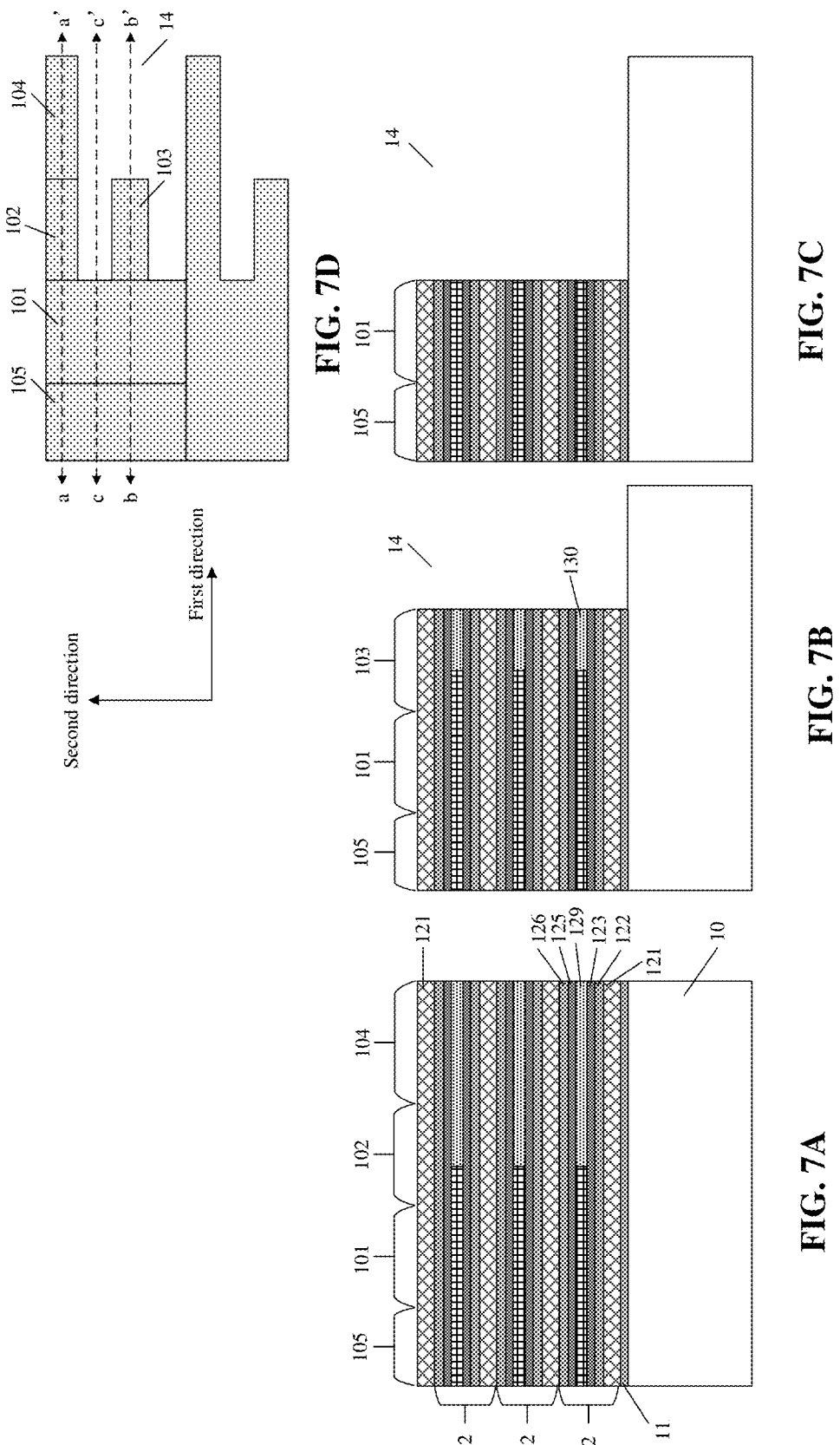
FIGS. 7A-7D illustrate schematic diagrams of a structure obtained after transferring a first pattern to the stack structure and the first metal layers provided by the embodiments of the disclosure.

FIGS. 7A-7D illustrate schematic diagrams of a structure obtained after transferring the first pattern to the stack structure and the first metal layers. FIG. 7D illustrates a top view. In FIG. 7D, the channel area 101, the first source-drain area 102, and the second source-drain area 103 are marked, and meanwhile, a capacitor area 104 and a word line area 105 are also marked. As shown in FIG. 7D, the channel area 101 extends in the second direction. Both the first source-drain area 102 and the second source-drain area 103 extend in the first direction. Both the first source-drain area 102 and the second source-drain area 103 are located on the same side of the channel area 101 (in FIG. 7D, the first source-drain area 102 and the second source-drain area 103 are located on the right side of the channel area 101). The capacitor area 104 is connected to the first source-drain area 102. The first source-drain area is located between the channel area 101 and the capacitor area 104. The capacitor area 104 also extends in the first direction. The word line area 105 is located on a side, far away from the capacitor area 104, of the channel area 101, and is connected to the channel area 101. In FIG. 7D, the word line area 105 is located on the left side of the channel area 101. The first direction intersects the second direction, and an included angle is 90° as shown in FIG. 7D.

FIG. 7A illustrates a sectional view taken along direction aa' in FIG. 7D, FIG. 7B illustrates a sectional view taken along direction bb' in FIG. 7D, and FIG. 7C illustrates a sectional view taken along direction cc' in FIG. 7D. The first pattern is transferred and the first mask layer is removed. A trench formed in the stack structure is marked as a dividing trench 14. The first metal layer in the stack layer 12 is also divided by the dividing trench 14. As shown in FIG. 7A, at the positions corresponding to the first source-drain area 102 and the capacitor area 104, the first metal layer remaining in the stack layer 12 forms a first metal pillar 129. As shown in FIG. 7B, at the position corresponding to the second source-drain area 103, the first metal layer remaining in the stack layer 12 forms a second metal pillar 130. It can be seen that the length of the first metal pillar 129 is the same as that of the first metal layer. The length of the second metal pillar 130 is less than the length of the first metal layer. As shown in FIG. 7C, in direction cc', the first metal layer is completely removed. That is to say, the first groove also divides the first metal layer into the first metal pillar 129 and the second metal pillar 130 while dividing the stack structure into several areas. Both the first metal pillar 129 and the second metal pillar 130 extend in the first direction.

In some embodiments, the method may further include the following operations.

A support structure is formed in the dividing trench.

Multiple slits are formed in the support structure. Each slit is formed at a junction of the support structure and the capacitor area.

Part of the first metal pillar located in the capacitor area are exposed by removing the substrate isolation layer, the support layer, the first isolation layer, the first protective layer, the second protective layer and the second isolation layer in the capacitor area located between slits. The exposed part of first metal pillar forms a lower electrode layer. The unexposed part of first metal pillar is located in the first source area and forms the first electrode structure.

A dielectric layer, an upper electrode layer, and a filling layer are formed on the surface of the lower electrode layer.

Figures 8A, 8B, 8C, 8D:
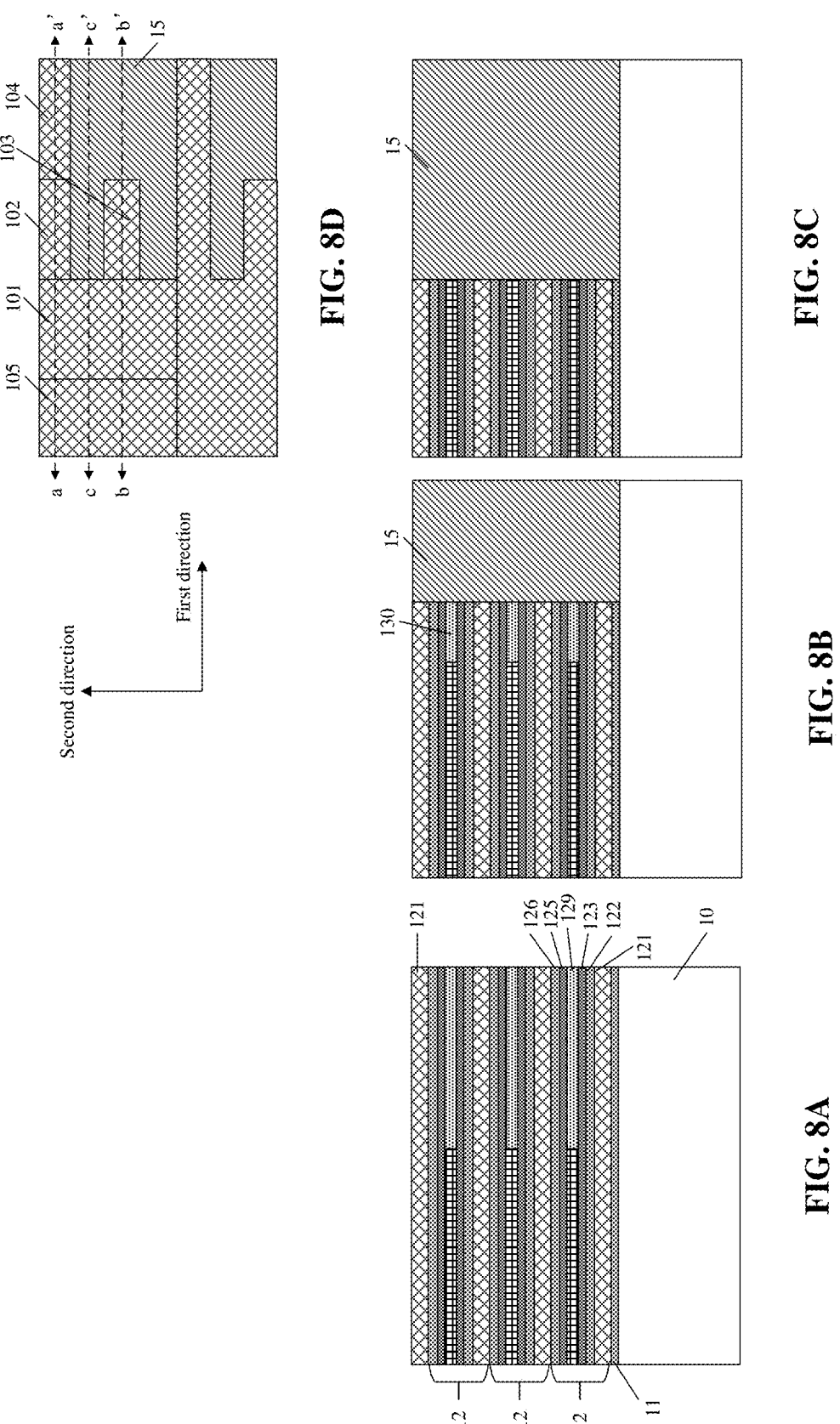
FIGS. 8A-8D illustrate schematic diagrams of a structure obtained after forming support structures provided by the embodiments of the disclosure.

It is to be noted that FIGS. 8A-8D illustrates a schematic diagram of a structure obtained after forming a support structure. FIG. 8A illustrates a sectional view of direction aa' in FIG. 8D, FIG. 8B illustrates a sectional view of direction bb' in FIG. 8D, and FIG. 8C illustrates a sectional view of direction cc' in FIG. 8D.

As shown in FIG. 8, the support structure 15 completely fills the dividing trench. The support structure 15 may be formed by depositing. It is to be noted that the support structure 15 and the support layer 121 may be made of the same material, such as silicon nitride. In order distinguish the two, the support layer 121 and the support structure 15 are shown with different filling in the drawings.

Figure 9:
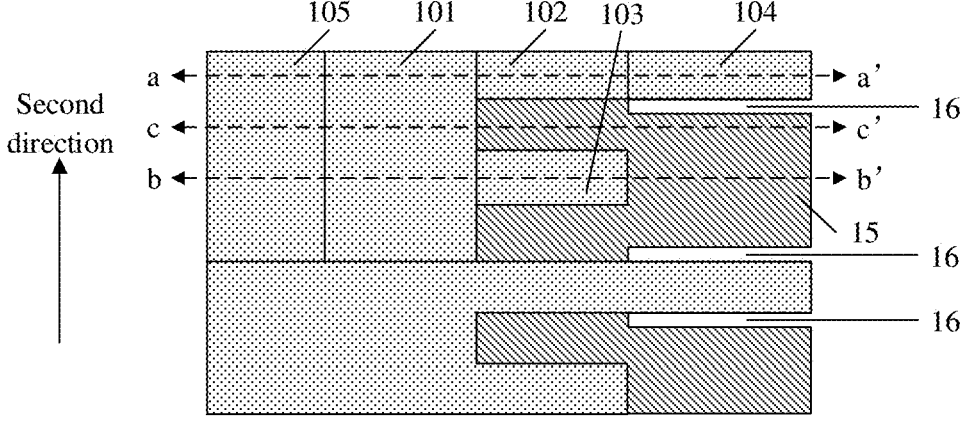
FIG. 9 illustrates a top view of a structure obtained after forming slits provided by the embodiments of the disclosure.

Multiple slits are formed in the support structure, so as to facilitate a subsequent etching process. FIG. 9 illustrates a top view of a structure obtained after forming the slits. As shown in FIG. 9, the slits 16 may be formed by etching the support structure 15, and are formed at the position of the junction of the support structure 15 and the capacitor area 104. That is to say, the slits 16 are formed in both sides of each capacitor area 104. The capacitor area 104 is located between two slits 16.

Figure 10:
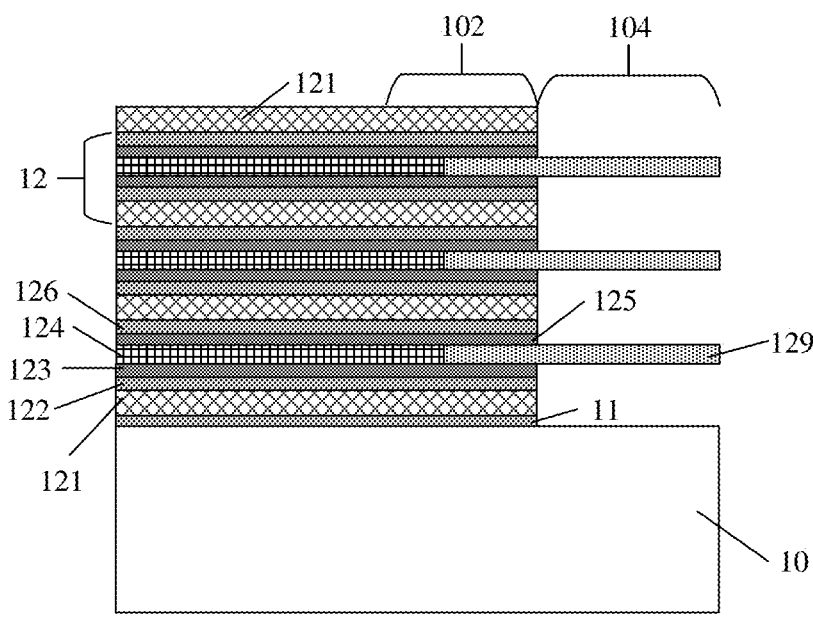
FIG. 10 illustrates a schematic diagram of a structure obtained after exposing lower electrode layers provided by the embodiments of the disclosure.

The substrate isolation layer, the support layer, the first isolation layer, the first protective layer, and the second protective layer that are located in the capacitor area are all removed by introducing an etching agent or an etching gas through the slits, so as to expose the lower electrode layer. FIG. 10 illustrates a schematic diagram of a structure obtained after exposing a lower electrode layer, which corresponds to a cross section taken along direction aa' in the foregoing top view. As shown in FIG. 10, the exposed part of the first metal pillar 129 is the part of the first metal pillar 129 located in the capacitor area 104, which is arranged to form the lower electrode layer of a capacitor. The unexposed part of the first metal pillar 129 is the part of the first metal pillar 129 located in the first source-drain area 102, which is used as a first electrode structure to electrically connect the lower electrode layer of the capacitor with a terminal of the subsequently formed transistor. In addition, the second metal pillars 130 are all located in the second source-drain area 103, and are used as the second electrode structure to electrically connect the subsequently formed bit line with the other terminal of the transistor.

Figures 11A, 11B:
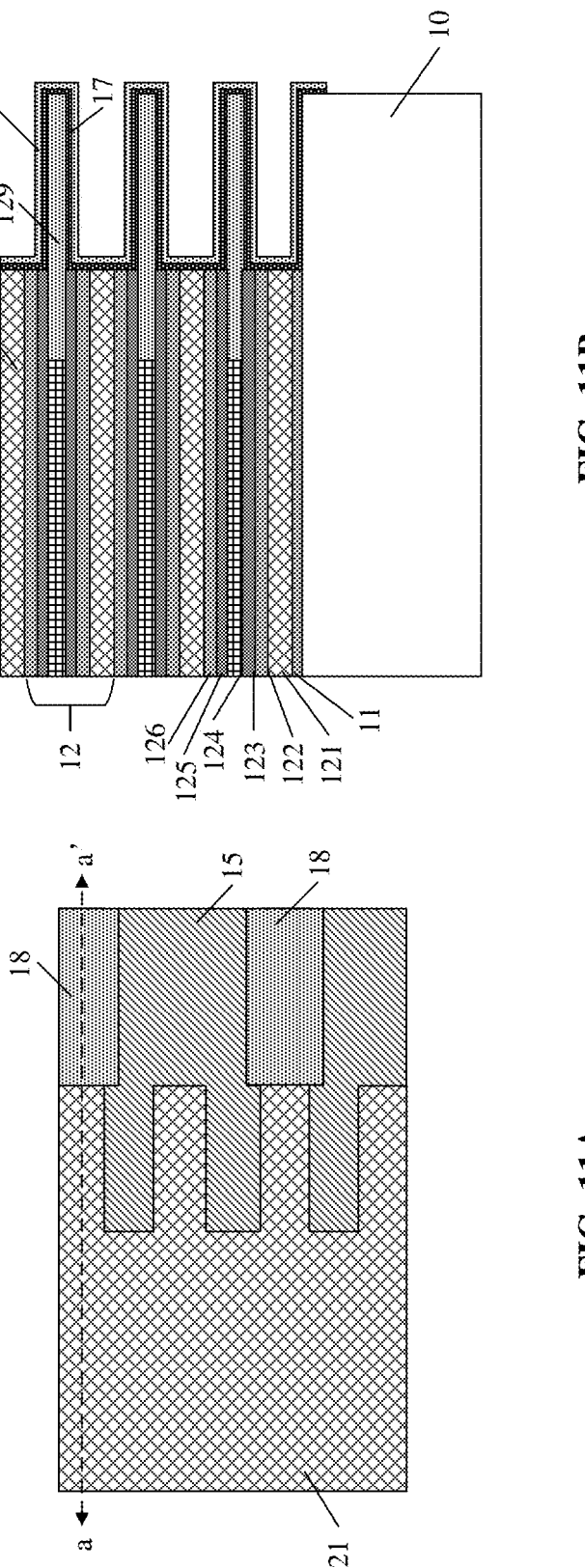
FIGS. 11A-11B illustrate schematic diagrams of a structure obtained after forming upper electrode layers provided by the embodiments of the disclosure.

A dielectric layer and an upper electrode layer are formed on the surface of the lower electrode layer to obtain a capacitor. FIGS. 11A and 11B illustrate schematic structural diagrams obtained after forming the upper electrode layer. FIG. 11A illustrates a top view, and FIG. 11B illustrates a sectional view taken along direction aa' in FIG. 11A. As shown in FIG. 11B, after the lower electrode layer is exposed, first a dielectric layer 17 is formed on the surface of the lower electrode layer, meanwhile, the dielectric layer 17 is also formed on the surfaces of other parts in the exposed stack structure; and then, an upper electrode layer 18 (also referred to as an upper polar plate, a lower electrode plate, etc.) is formed on the surface of the dielectric layer 17, so as to form multiple capacitors. Both the dielectric layer 17 and the upper electrode layer 18 may be formed by depositing. The material of the dielectric layer 17 may be a high dielectric constant (High K) material, for example, hafnium oxide, zirconia, lanthanum oxide, aluminum oxide, hafnium silicon oxide, and hafnium nitrogen oxide. The material of the upper electrode layer 18 may be the same as that of the first metal layer, which will not be elaborated herein.

Figures 12A, 12B:
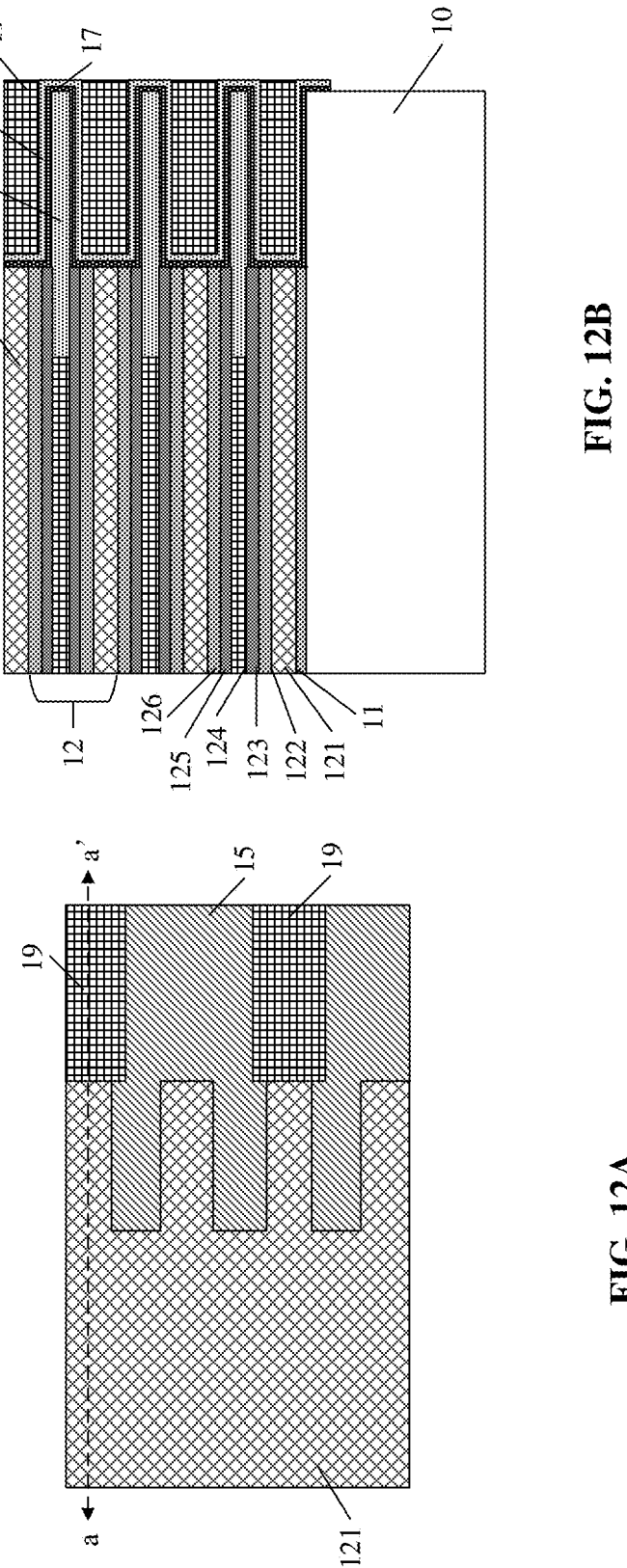
FIGS. 12A-12B illustrate schematic diagrams of a structure obtained after forming filling structures provided by the embodiments of the disclosure.

A filling layer is formed on the surface of the upper electrode layer. FIGS. 12A and 12B illustrate schematic diagrams of a structure obtained after forming the filling layer, FIG. 12A illustrates a top view, and FIG. 12B illustrates a sectional view taken along direction aa' in FIG. 12A. The filling structure 19 may be formed by depositing. The material of the filling structure 19 may be polysilicon. As shown in FIG. 12, the filling structure 19 completely fills voids that are formed by the upper electrode layer 18.

At S104, a first source-drain structure extending in the first direction is formed in the first source-drain area, and a second source-drain structure extending in the first direction is formed in the second source-drain area.

It is to be noted that multiple capacitors, multiple first electrode structures, and multiple second electrode structures have been formed in the foregoing operations. In this operation, the first source-drain structure and the second source-drain structure are formed. The first source-drain structure is formed in the first source-drain area and extends in the first direction. The second source-drain structure is formed in the second source-drain area and also extends in the first direction.

In some embodiments, the first source-drain structure extending in the first direction is formed in the first source-drain area, and the second source-drain structure extending in the first direction is formed in the second source-drain area, may include the following operations.

A second groove is formed in the stack layer by removing the remaining part of the sacrificial layer, and the second groove exposes the first electrode structure and the second metal pillar.

An initial source-drain structure is formed in the second groove.

Part of the initial source-drain structure is removed, and part of the initial source-drain structure connected to first electrode structure and part of the initial source-drain structure connected to the second metal pillar are remained to form the first source-drain structure and the second source-drain structure.

The part of the initial source-drain structure connected to the first electrode structure forms the first source-drain structure, and the part of the initial source-drain structure connected to the second metal pillar forms the second source-drain structure.

Figure 13A:
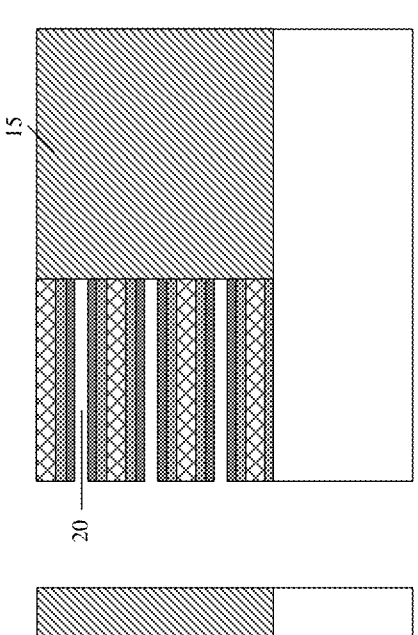
FIGS. 13A-13C illustrate schematic diagrams of a structure obtained after forming second grooves provided by the embodiments of the disclosure.
Figure 13B:
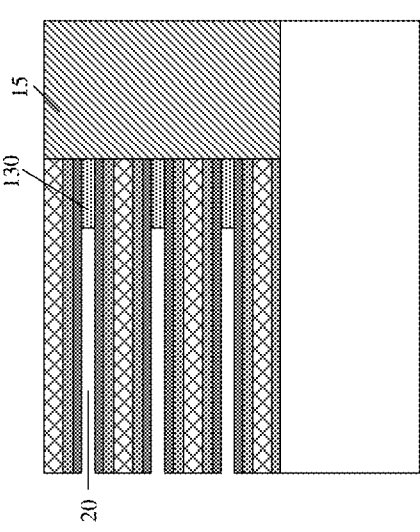
Figure 13C:
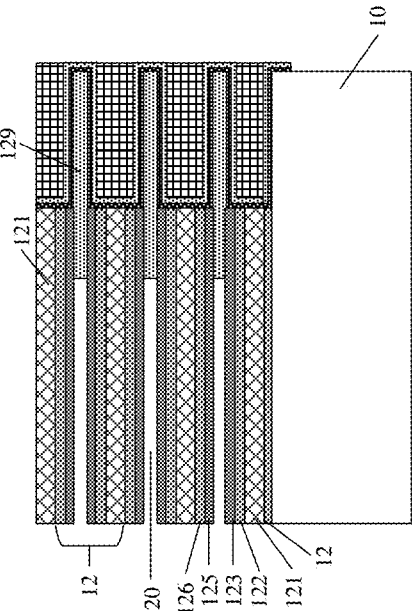

It is to be noted that FIGS. 13A-13C illustrate schematic diagrams of a structure obtained after forming a second groove, FIG. 13A illustrates a sectional view taken along the foregoing direction aa', FIG. 13B illustrates a sectional view taken along the foregoing direction bb', and FIG. 13C illustrates a sectional view taken along the foregoing direction cc'. As shown in FIGS. 13A-13C, at this time, the sacrificial layer has been completely removed. A second groove 20 is formed in the position of the original sacrificial layer.

Figure 14A:
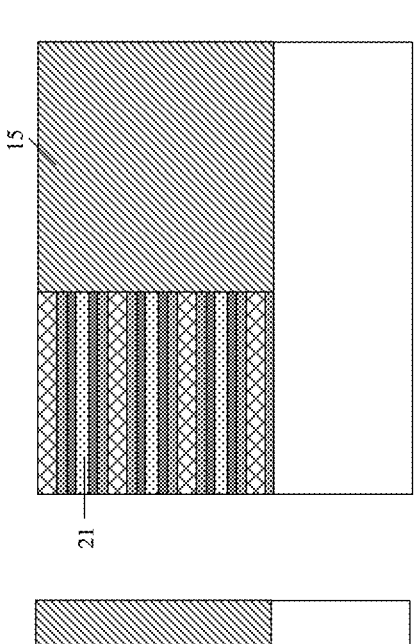
FIGS. 14A-14C illustrate schematic diagrams of a structure obtained after forming initial source-drain structures provided by the embodiments of the disclosure.
Figure 14B:
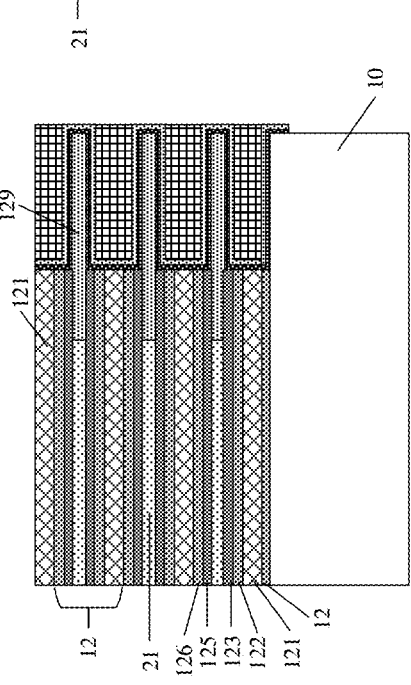
Figure 14C:

An initial source-drain structure is formed in the second groove. FIGS. 14A-14C illustrate schematic diagrams of a structure obtained after forming the initial source-drain structure, FIG. 14A illustrates a sectional view taken along the foregoing direction aa', FIG. 14B illustrates a sectional view taken along the foregoing direction bb', and FIG. 14C illustrates a sectional view taken along the foregoing direction cc'. As shown in FIGS. 14A-14C, an initial source-drain structure 21 is completely formed in the second groove. The initial source-drain structure 21 may be formed by Atomic layer Deposition (ALD). The material of the initial source-drain structure 21 may include at least one of the following: indium oxide ($In_2O_3$), zinc oxide (ZnO), indium zinc oxide (IZO), indium gallium oxide (IGO), indium gallium zinc oxide (IGZO), indium zinc tin oxide (IZTO), or zinc oxynitride (ZnON).

It is to be noted that, in the embodiments of the disclosure, the metal oxide materials such as IGZO is used as a channel material. The characteristic of this material is that it can be converted into a conductor or an insulator freely. Since IGZO is quite sensitive to both water and oxygen. $SiO_2$ (the first isolation layer and the second isolation layer) and SiN (the support layer) with a certain thickness may be arranged to isolate oxygen and water vapor in air.

Part of the initial source-drain structure is removed to form the first source-drain structure and the second source-drain structure. FIGS. 15A-15C illustrate schematic diagrams of a structure obtained after forming the first source-drain structure and the second source-drain structure, FIG. 15A illustrates a sectional view taken along the foregoing aa' direction, FIG. 15B illustrates a sectional view taken along the foregoing direction bb', and FIG. 15C illustrates a sectional view taken along the foregoing cc' direction. As shown in FIGS. 15A-15C, part of the initial source-drain structure is removed. In the direction aa', the initial source-drain structure connected to the first electrode structure (the first metal pillar 129) forms the first source-drain structure 22. In the direction bb', and the initial source-drain structure connected to the second electrode structure (the second metal pillar 130) forms the second source-drain structure 23. In the direction cc', the initial source-drain structure is completely removed. That is to say, in FIGS. 15A-15C, the first source-drain structure 22 and the second source-drain structure 23 are not connected. Moreover, both the first source-drain structure 22 and the second source-drain structure 23 extend in the first direction.

At S105, a channel structure extending in the second direction is formed in the trench area.

In the foregoing operations, after removing part of the initial source-drain structure to form the first source-drain structure and the second source-drain structure, the method may further include the following operation.

The first protective layer and the second protective layer not located on the surfaces of the first source-drain structure and the second source-drain structure are removed to form a third groove. The third groove exposes part of the first isolation layer and part of the second isolation layer.

It is to be noted that, as shown in FIGS. 15A-15C, the first protective layer 123 and the second protective layer 125 located on the surfaces of the first source-drain structure 22 and the second source-drain structure 23 are retained, and the first protective layer 123 and the second protective layer 125 at other positions are removed to form third grooves 24. The third grooves 24 expose part of the first isolation layer 122 and part of the second isolation layer 126.

Then, a channel structure is formed in the third groove. In some embodiments, the operation that the channel structure extending in the second direction is formed in the channel area may include the following operations.

An initial channel layer is formed in the third groove. The initial channel layer is formed on the surfaces of the exposed first isolation layer, the second isolation layer, the first source-drain structure, the second source-drain structure, the first protective layer and the second protective layer. The initial channel layer includes an initial upper channel layer, an initial lower channel layer, and a channel connecting layer. The initial upper channel layer is formed on the surface of the second isolation layer. The initial lower channel layer is formed on the surface of the first isolation layer. The channel connecting layer is formed on the surfaces of the first source-drain structure, the support structure, and the second source-drain structure.

Part of the initial upper channel layer and part of the initial lower channel layer are removed in first direction, the remaining initial upper channel layer forms an upper channel layer, and the remaining initial lower channel layer forms a lower channel layer.

The upper channel layer, the lower channel layer, and the channel connecting layer form the channel structure.

Figure 16C:
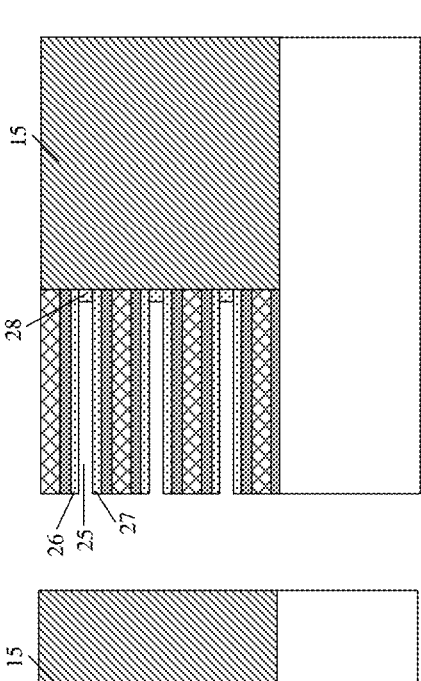
FIGS. 16A-16C illustrate schematic diagrams of a structure obtained after forming initial channel layers provided by the embodiments of the disclosure.
Figure 16B:
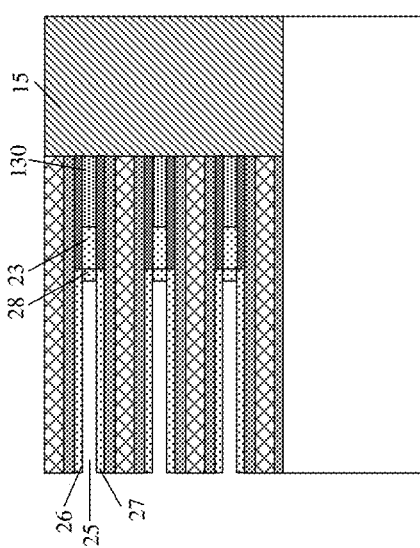
Figure 16A:
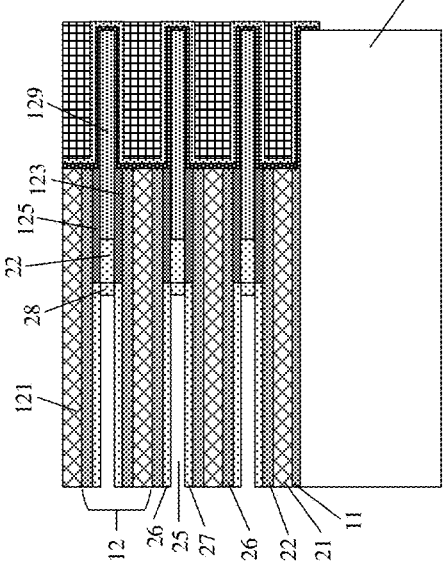

It is to be noted that FIGS. 16A-16C illustrate schematic diagrams of a structure obtained after forming the initial channel layer. FIG. 16A illustrates a sectional view taken along the foregoing aa' direction, FIG. 16B illustrates a sectional view taken along the foregoing direction bb', and FIG. 16C illustrates a sectional view taken along the foregoing cc' direction. As shown in FIG. 16, the initial channel layer consists of an initial upper channel layer 26, an initial lower channel layer 27, and a channel connecting structure 28. The initial channel layer is formed in the third groove, but does not completely fill the third groove. The initial upper channel layer 26 is formed on the surface of the second isolation layer 126. The initial lower channel layer 27 is formed on the surface of the first isolation layer 122. The channel connecting structure 28 is formed on the surfaces of the first source-drain structure 22, the second source-drain structure 23, and the second isolation layer 126, and the located between the initial upper channel layer 26 and the initial lower channel layer 27. A fourth groove 25 is formed between the initial upper channel layer 26 and the initial lower channel layer 27.

It is also to be noted that the initial upper channel layer 26, the initial lower channel layer 27, and the channel connecting structure 28 are formed by depositing simultaneously. The initial upper channel layer 26 is connected to the initial lower channel layer 27 by the channel connecting structure 28. The three form a complete initial channel layer, which is divided into three parts for the convenience of description. Therefore, lines are added in the drawings for distinguishing. In practice, the initial channel layer is a complete whole body, which does not need to be distinguished without a boundary. In addition, the materials of the initial channel layer, the first source-drain structure 22, and the second source-drain structure 23 may be the same. Lines are added at the junctions in the drawings for distinguishing only. That is to say, the material of the initial channel layer may include at least one of the following: indium oxide (In2O3), zinc oxide (ZnO), indium zinc oxide (IZO), indium gallium oxide (IGO), indium gallium zinc oxide (IGZO), indium zinc tin oxide (IZTO), or zinc oxynitride (ZnON).

Figure 17:
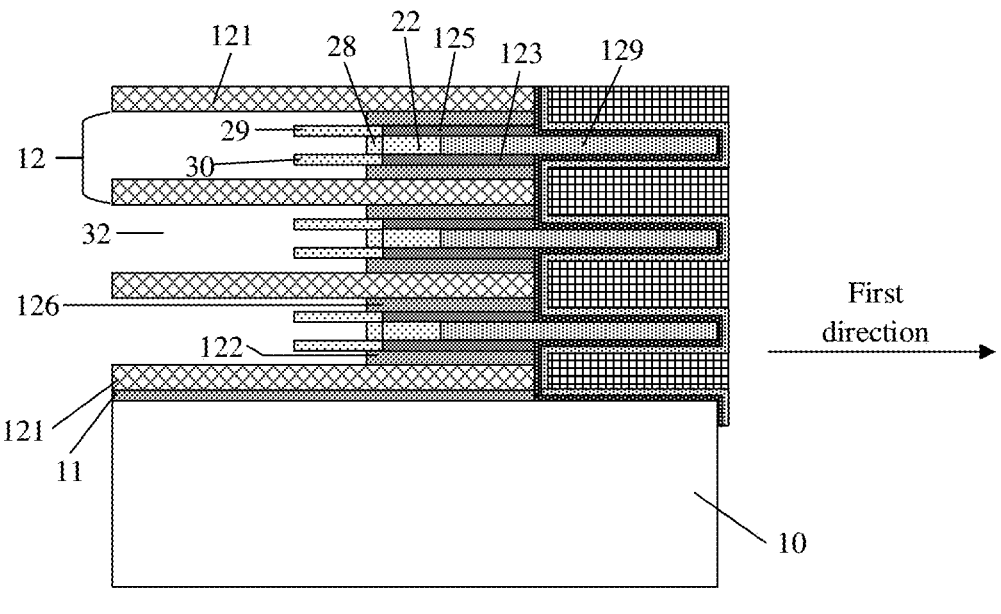
FIG. 17 illustrates a schematic diagram of a structure obtained after forming upper channel layers and lower channel layers provided by the embodiments of the disclosure.

Part of the initial upper channel layer and part of the initial lower channel layer are removed in the first direction, so as to form an upper channel layer and a lower channel layer. FIG. 17 illustrates a schematic diagram of a structure obtained after forming the upper channel layer and the lower channel layer. FIG. 17 illustrates a sectional view taken along the foregoing direction aa'. As shown in FIG. 17, part of the initial upper channel layer and part of the initial lower channel layer are removed in the first direction. The remaining initial upper channel layer forms an upper channel layer 29, and the remaining initial lower channel layer forms a lower channel layer 30.

Thus, the channel structure formed in the embodiments of the disclosure includes an upper channel layer and a lower channel layer that extend and are arranged horizontally up and down. The two form a dual channel structure. Compared with a conventional channel structure, the dual channel structure can bear higher current, has higher performance, and is not easily damaged by high current.

In some embodiments, before removing the part of the initial upper channel layer and the part of the lower channel layer in the first direction, the method may further include the following operation.

A channel sacrificial layer is formed in the fourth groove.

The operation that removing the part of the initial upper channel layer and the part of the lower channel layer in first direction may include the following operations.

An etching process is performed on the initial upper channel layer and the initial lower channel layer by taking the channel sacrificial layer as an etching protective layer of the initial channel layer, so to remove part of the initial upper channel layer and part of the lower channel layer.

The channel sacrificial layer is removed.

Figure 18:
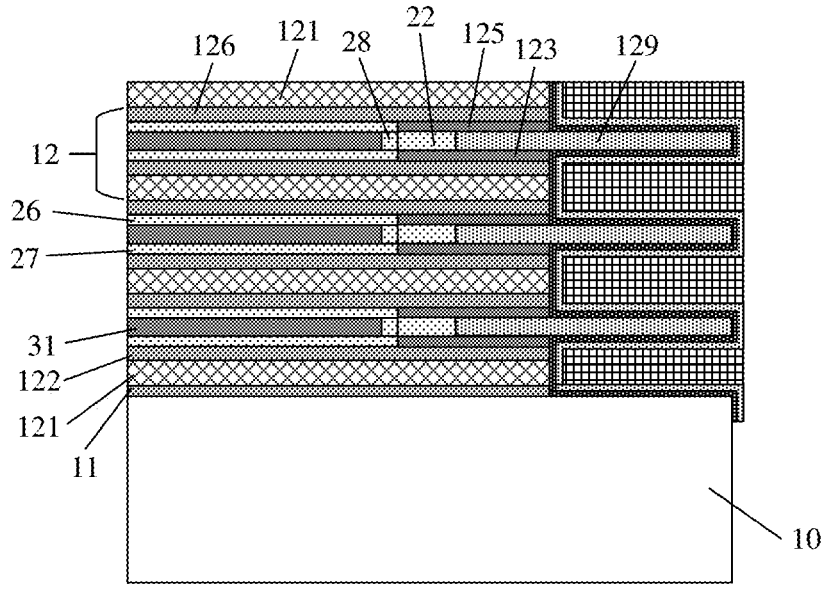
FIG. 18 illustrates a schematic diagram of a structure obtained after forming etching protective layers provided by the embodiments of the disclosure.

It is to be noted that part of the initial upper channel layer and part of the initial lower channel layer may be removed by etching. In order to prevent the initial upper channel layer and the initial lower channel layer from being removed too much, and in order to prevent the surfaces of the initial upper channel layer and the initial lower channel layer from being etched, in the embodiments of the disclosure, an etching protective layer may be formed in advance before removing part of the initial upper channel layer and part of the initial lower channel layer. FIG. 18 illustrates a schematic diagram of a structure obtained after forming an etching protective layer. As shown in FIG. 18, the etching protective layer 31 is completely formed in the fourth groove.

The initial upper channel layer 26 and the initial lower channel layer 27 are etched by taking the etching protective layer 31 as protection until an upper channel layer 29 and a lower channel layer 30 are obtained. Thus, the initial upper channel layer 26 and the initial lower channel layer 27 can be prevented from being etched too much to avoid adverse effects on the structure, and then the etching protective layer 31 is removed. The material of the etching protective layer 31 may be a low k material.

In some embodiments, the method may further include the following operations.

Part of the first isolation layer and part of the second isolation layer are removed, and a fifth groove is formed between the support layers to expose the upper channel layer and lower channel layer.

Third isolation layers are formed on the surfaces of the channel structure and the support layer that are exposed by the fifth groove. The third isolation layer formed on the surface of the channel structure forms a gate dielectric layer.

A second metal layer is formed between the third isolation layers. Part of the second metal layer formed in the channel area forms a gate conductive layer. Part of the second metal layer formed in a word line area forms a word line. The word line extends in the second direction.

It is to be noted that part of the first isolation layer and part of the second isolation layer may also be removed when or after forming the upper channel layer and the lower channel layer by etching, so as to form a fifth groove 32. The fifth groove 32 exposes the upper channel layer and the lower channel layer, which is specifically as shown in FIG. 17. The upper channel layer 29, the lower channel layer 30, and the channel connecting layer 28 form a channel structure.

Figure 19:
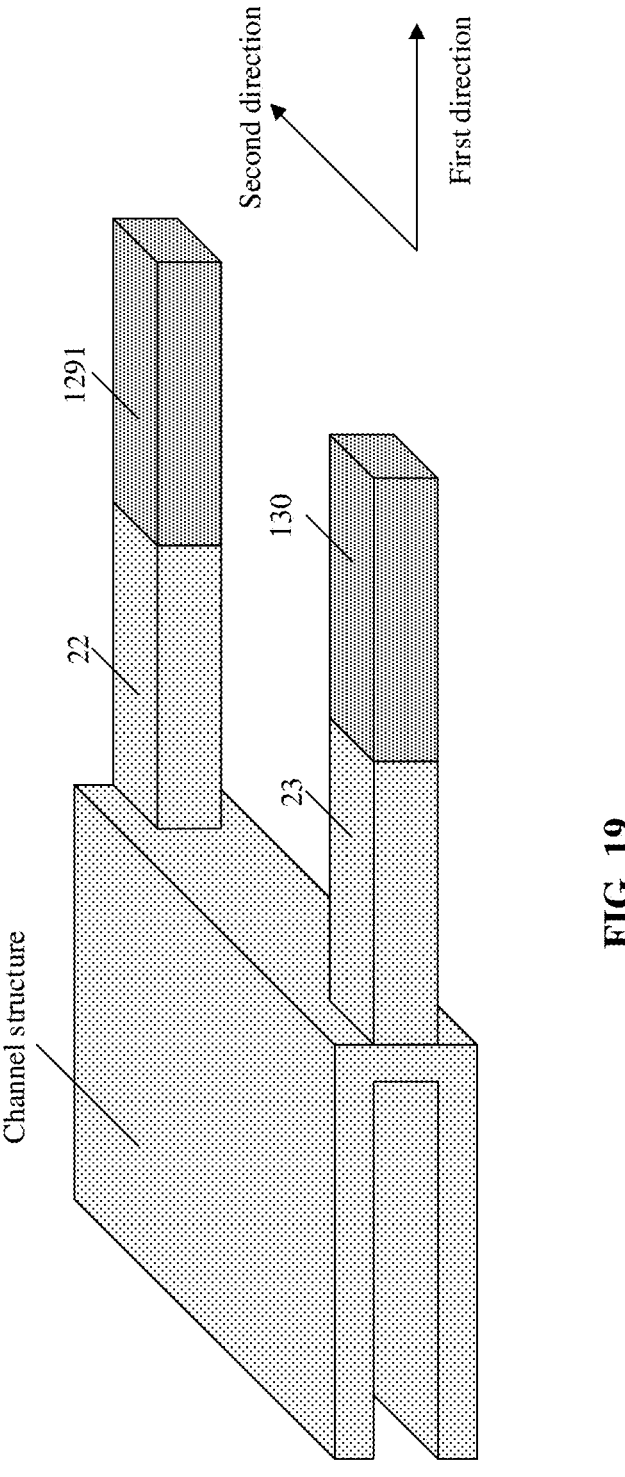
FIG. 19 illustrates a first schematic diagram of a partial structure of a semiconductor structure provided by the embodiments of the disclosure.

Reference is made to FIG. 19, which illustrates a first schematic diagram of a partial structure of a semiconductor structure provided by the embodiments of the disclosure. FIG. 19 illustrates a three-dimensional structural diagram of a connecting relationship of the channel structure, the first source-drain structure 22, the second source-drain structure 23, the first electrode structure 1291, and the second electrode structure (the second metal pillar 130). As shown in FIG. 19, the first source-drain structure 22 extends in the first direction, herein a terminal of the first source-drain structure is connected to the first electrode structure 1291, and the other terminal of the first source-drain structure is connected to the channel structure. The second source-drain structure 23 extends in the first direction, herein a terminal of the second source-drain structure is connected to the second electrode structure, and the other terminal of the second source-drain structure is connected to the channel structure. The channel structure extends in the second direction. The first source-drain structure 22 and the second source-drain structure 23 are respectively arranged to form a source and a drain of a transistor. In this structure, as shown in FIG. 19, the first source-drain structure 22, the second source-drain structure 23, and the channel structure are U-shaped (from a top view). Thus, both the first source-drain structure 22 and the second source-drain structure 23 are located on a side of an extending direction of the channel structure and are perpendicularly connected to the channel structure. Compared with the conventional structure that a source and a drain are respectively distributed on the left side and the right side of a channel, this U-shaped structure is beneficial to reducing the volume of a semiconductor structure, and improving the integration degree of the semiconductor structure.

Figure 20:
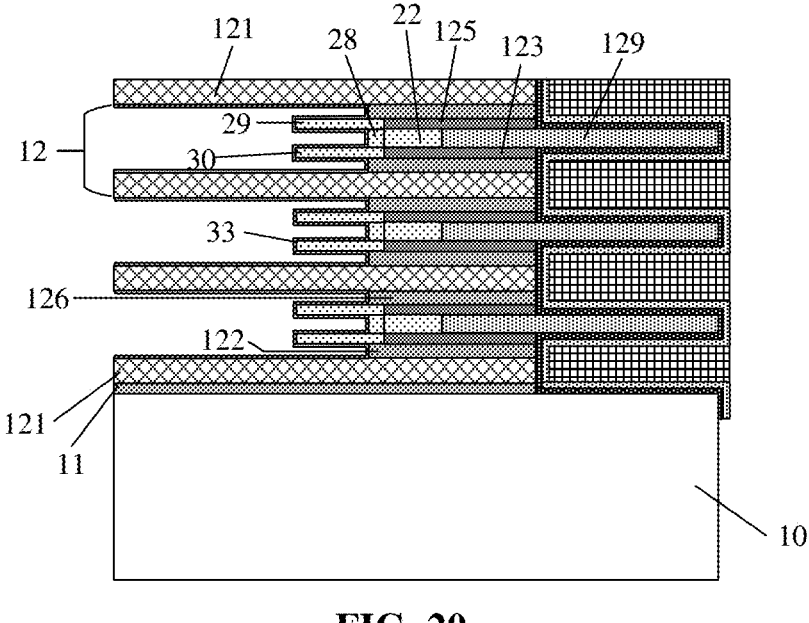
FIG. 20 illustrates a schematic diagram of a structure obtained after forming third isolation layers provided by the embodiments of the disclosure.

Continue to form third isolation layers on the surfaces of the channel structure and the support layer. FIG. 20 illustrates a schematic diagram of a structure obtained after forming the third isolation layers. As shown in FIG. 20, the third isolation layers 33 are formed on the surfaces of the channel structure and the support layer 121 in the fifth groove. The third isolation layers 33 may be formed by depositing. The material of the third isolation layers 33 may be silicon dioxide. The third isolation layer 33 formed on the surface of the channel structure forms a gate dielectric layer (also referred to as a gate oxide layer) of a transistor. The third isolation layer 33 formed on the surface of the support layer 121 is arranged insulate and isolate a word line that will be subsequently formed.

Figure 21:
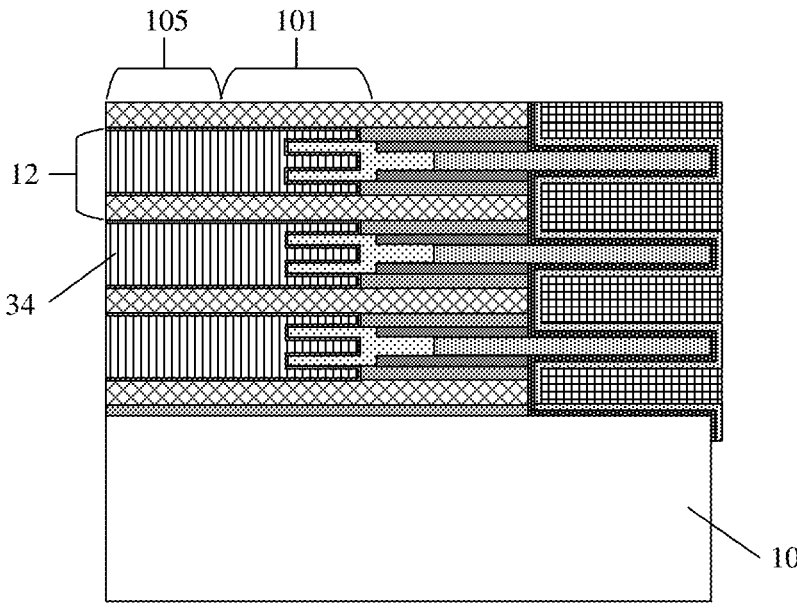
FIG. 21 illustrates a schematic diagram of a structure obtained after forming second metal layers provided by the embodiments of the disclosure.

A second metal layer is formed between the third isolation layers. FIG. 21 illustrates a schematic diagram of a structure obtained after forming second metal layers. As shown in FIG. 21, each second metal layer 34 completely fills the voids between the third isolation layers 33, that is, completely fills the fifth groove. Here, a part of the second metal layer 34 formed in the channel area 101 forms a gate conductive layer of a transistor, and the other part of the second metal layer 34 formed in the word line area 105 forms a word line. That is to say, in the embodiments of the disclosure, the word line and the gate conductive layer are formed integrally. The word lines may be in a stepped shape.

Figure 22:
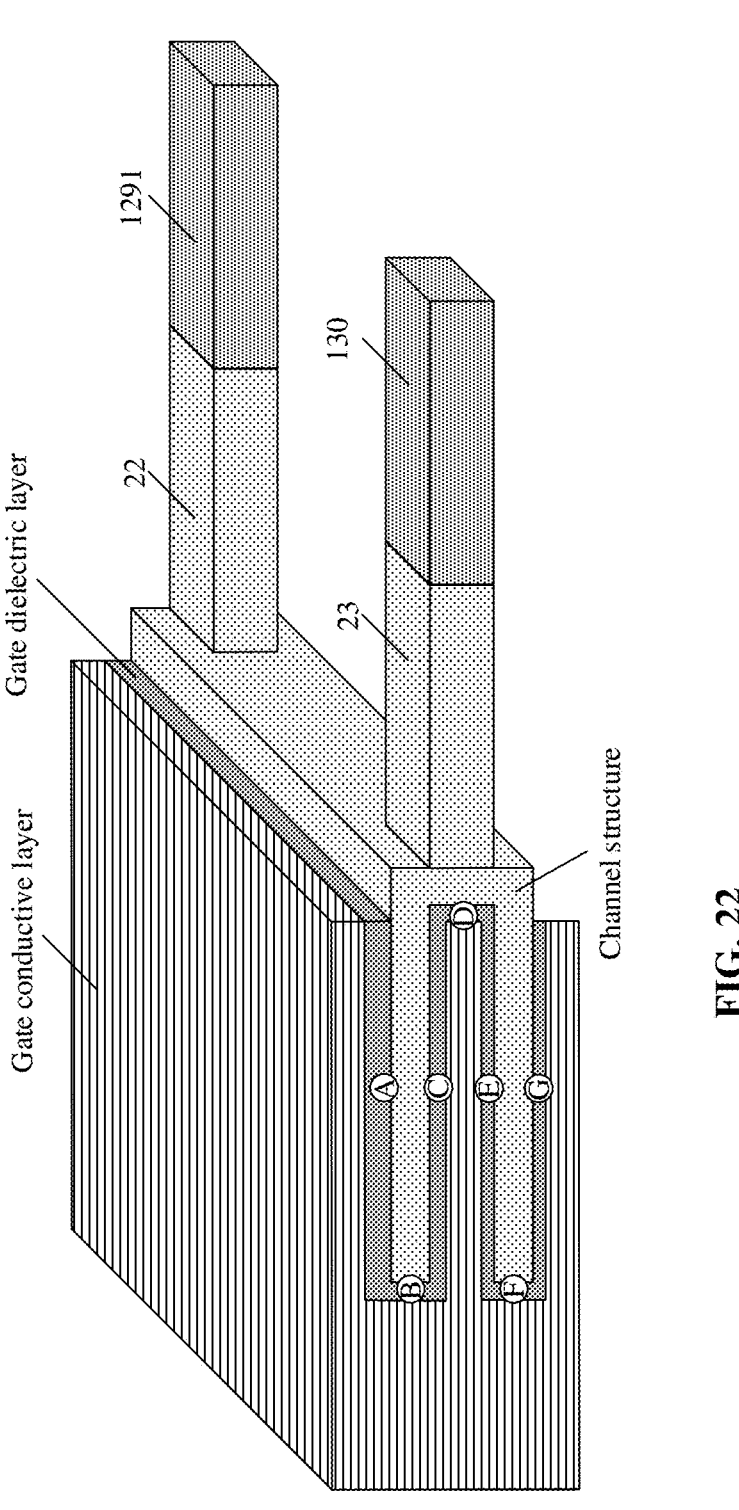
FIG. 22 illustrates a second schematic diagram of a partial structure of a semiconductor structure provided by the embodiments of the disclosure.

Reference is made to FIG. 22, which illustrates a second schematic diagram of a part of a semiconductor structure provided by the embodiments of the disclosure. FIG. 22 illustrates a schematic diagram of a structure after forming the gate dielectric layer and the gate conductive layer on the basis of FIG. 19. In this structure, as shown in FIG. 22, the first source-drain structure 22, the second source-drain structure 23, the channel structure, the gate dielectric layer, and the gate conductive layer form a transverse U-shaped transistor. Moreover, the gate conductive layer, the gate dielectric layer, and the channel structure in the transistor form a seven-surface-gate-around structure. Specifically, the seven surfaces are as shown in A, B, C, D, E, F, and G in FIG. 22. On the basis of the seven-surface-gate-around structure, the effective channel length can be ensured while reducing the dimension of the transistor, which improves the stability and the reliability of the semiconductor structure.

So far, in the semiconductor structure, the capacitor, the transistor, and the word line have been formed. Then, bit lines are formed. In some embodiments, the method may include the following operations.

The stack structure and the support structure are patterned to form a bit line trench. The bit line trench exposes a side, far away from the second source-drain structure, of part of the second metal pillar.

The bit line is formed in the bit line trench. The bit line extends in a third direction.

Figures 23A, 23B:
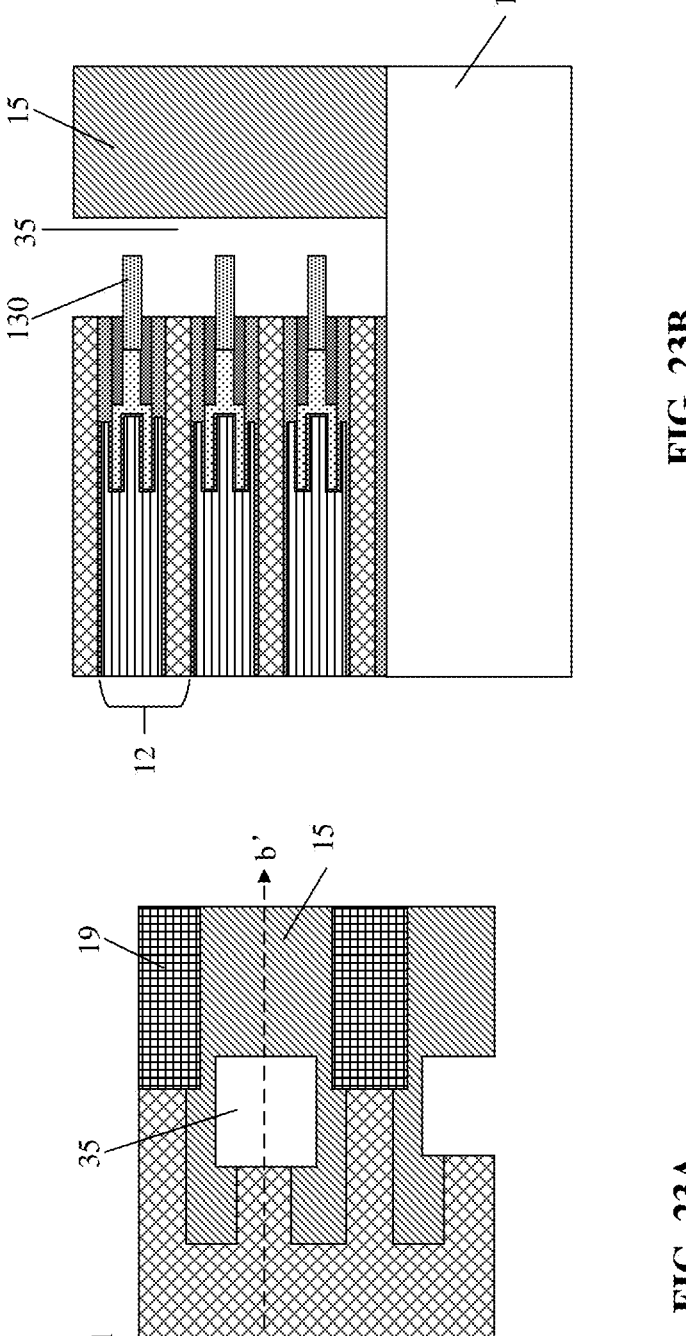
FIGS. 23A-23B illustrate schematic diagrams of a structure obtained after forming bit line trenches provided by the embodiments of the disclosure.

It is to be noted that FIG. 23 illustrates a schematic diagram of a structure obtained after forming bit line trenches. As shown in FIG. 23, the bit line trench 35 exposes part of the second metal pillar 130. A method for forming the bit line trench 35 may include the following operations: first, a second mask layer is formed on the structure obtained in the last operation. The second mask layer has a second pattern. The second pattern exposes an area where the bit line needs to be formed. Then, the second pattern is transferred. The stack structure and the support structure 15 located below the second pattern are removed to expose part of the second metal pillar 130, and the second mask layer is removed.

Then, a bit line is formed in the bit line trench. FIGS. 24A and 24B illustrate schematic diagrams of a structure obtained after forming the bit lines. As shown in FIGS. 24A and 24B, the bit line 36 is completely formed in the bit line tench. The second source-drain structure 23 and the bit line 36 are electrically connected by the second metal pillar 130 (that is, the second electrode structure).

As shown in FIG. 24B, the bit line 36 extends in the third direction. The transistors formed in different stack layers may share the same bit line 36. The bit line 36 may be formed by depositing. The material of the bit line 36 may include a conductive material such as titanium nitride or metal.

It is also to be noted that, in the embodiments of the disclosure, multiple transistors may be formed simultaneously. In each channel area, the channel structure, the gate dielectric layer, and the gate conductive layer form a gate structure of the transistor. In the second direction, multiple gate structures are arranged. At this time, multiple gate structures are also connected together, so the gate structures of the plurality of transistors also need to be divided. In some embodiments, the method may further include the following operations.

The stack structure is patterned to form a dividing trench between adjacent gate structures.

An isolation structure is formed in the dividing trench to divide the plurality of gate structures.

Figure 25:
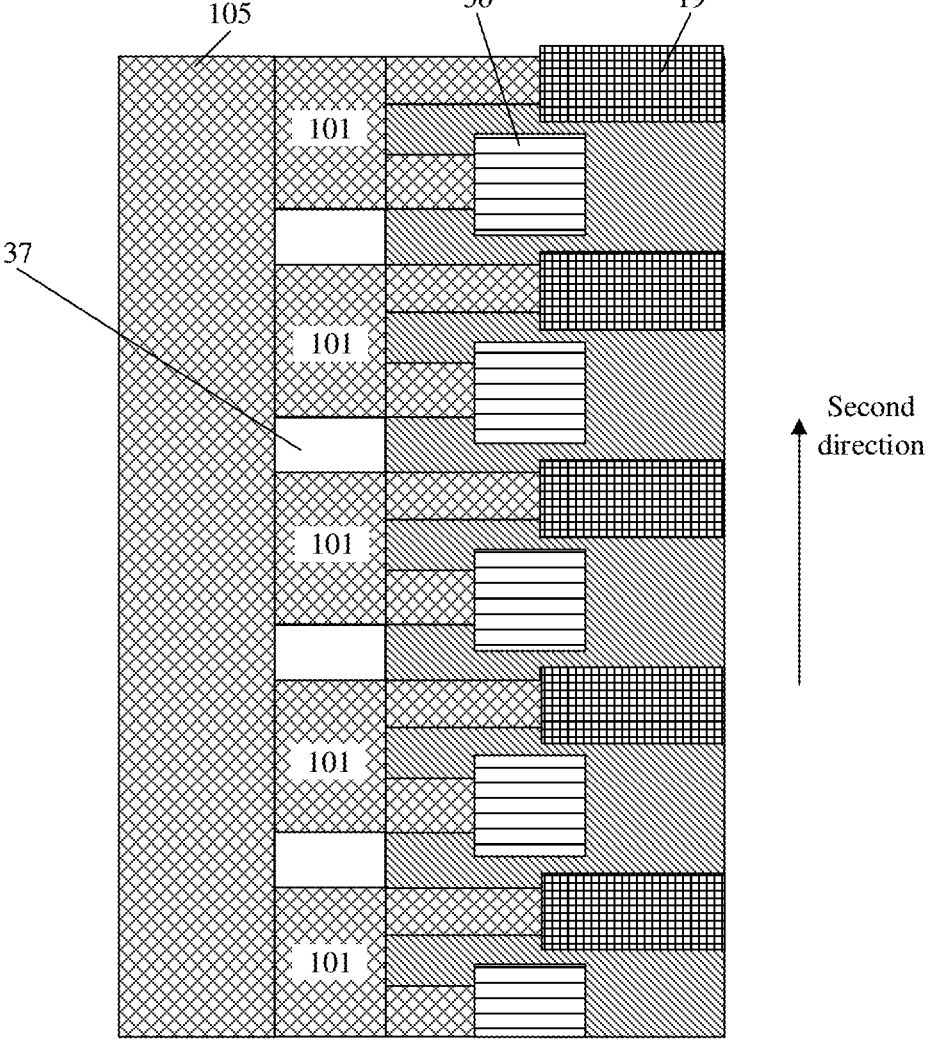
FIG. 25 illustrates a top view of a structure obtained after forming multiple isolation trenches provided by the embodiments of the disclosure.

It is to be noted that FIG. 25 illustrates a top view of a structure obtained after forming the isolation trenches. As shown in FIG. 25, the isolation trenches 37 are formed between the channel areas 101, that is, between the gate structures. In the second direction, the isolation trenches 37 and the channel areas 101 are arranged at intervals, so as to divide the gate structures that are connected together in the channel areas 101.

Figures 26A, 26B, 26C, 26D, 26E:
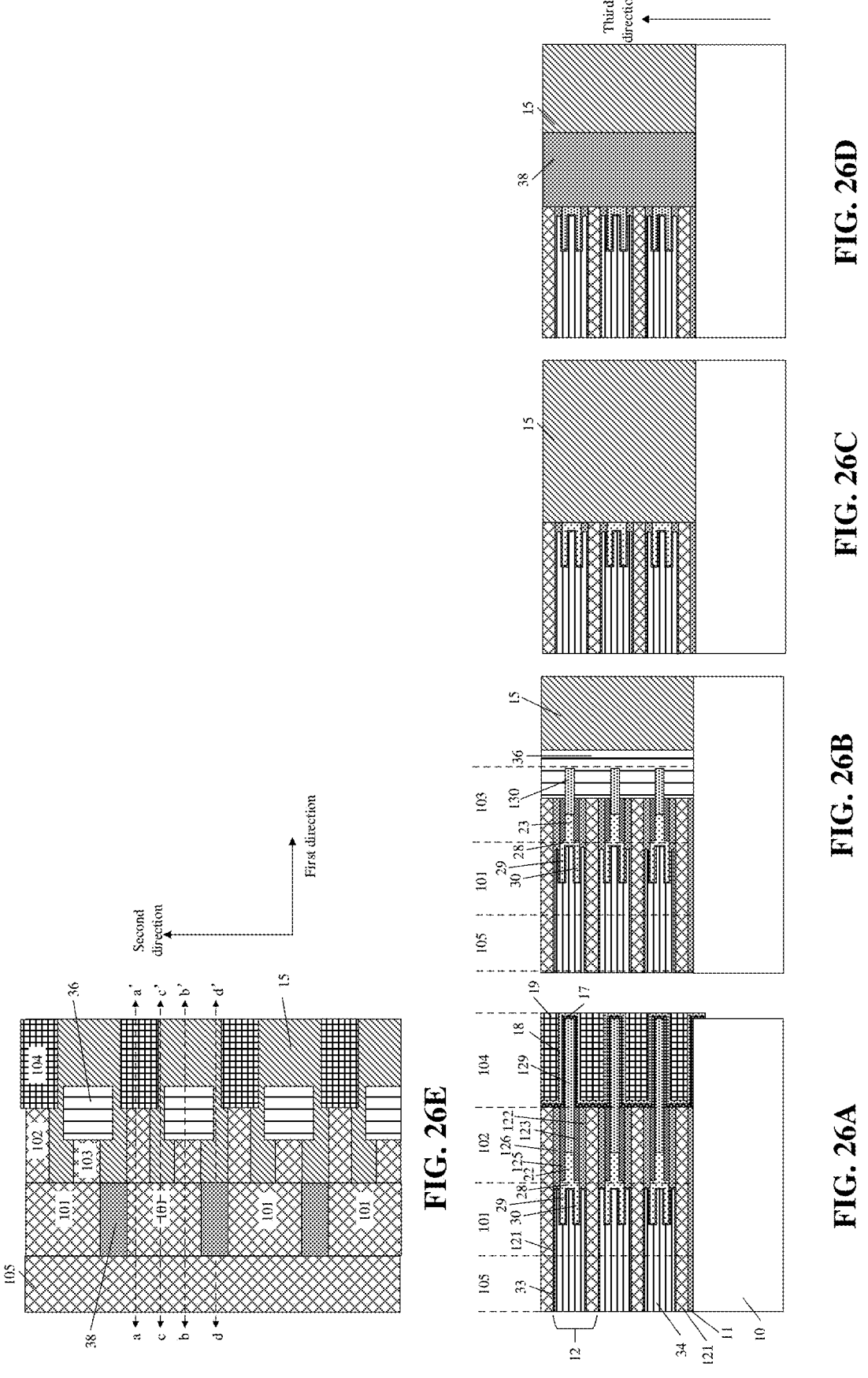
FIGS. 26A-26E illustrate schematic diagrams of composition structure of a semiconductor structure provided by the embodiments of the disclosure.

Further, the isolation structure is formed in each isolation trench to obtain the semiconductor structure provided by the embodiments of the disclosure. FIGS. 26A-26E illustrate schematic diagrams of composition structures of the semiconductor structure formed by the embodiments of the disclosure. FIG. 26E illustrates a top view, FIG. 26A illustrates a sectional view taken along direction aa' in FIG. 26E, FIG. 26B illustrates a sectional view taken along direction bb' in FIG. 26E, FIG. 26C illustrates a sectional view taken along direction cc' in FIG. 26E, and FIG. 26D illustrates a sectional view taken along direction dd' in FIG. 26E. As shown in FIG. 26, the isolation structure is completely formed in the isolation trench 37. It can be obviously seen from FIG. 26E that, the channel areas 101 that are connected together are divided by the isolation structures 38. That is, the gate structures that are formed in the channel areas and connected together are divided. The isolation structure 38 may be formed by depositing. The material may include an insulating material such as silicon dioxide, so that various gate structures may be insulated and isolated, thereby avoiding electric leakage.

It is also to be noted that, taking a DRAM as an example, a 1T1C structure is a basic storage unit. In FIG. 26E, the gate structures are divided by the isolation structures 38. That is to say, each 1T1C structure unit is divided into an independent storage unit, so as to avoid electric leakage interference with each other.

Figure 27:
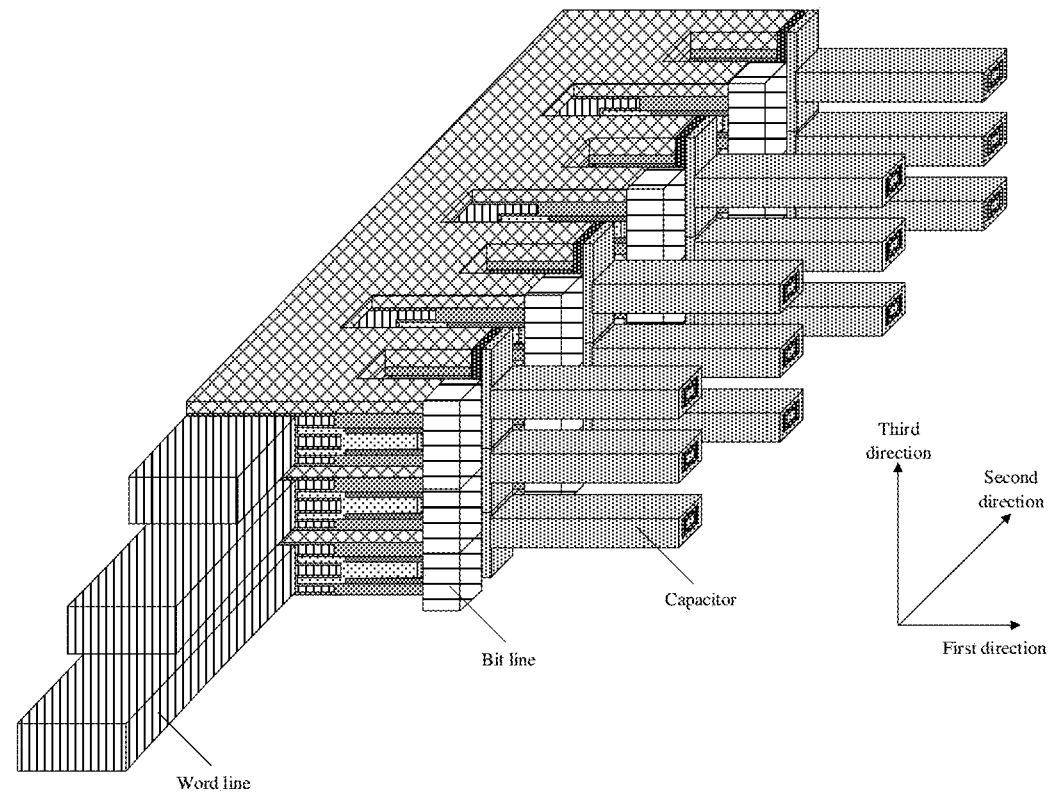
FIG. 27 illustrates a schematic diagram of a three-dimensional structure of the semiconductor structure provided by the embodiments of the disclosure.

Exemplarily, reference is made to FIG. 27, which illustrates a schematic diagram of a three-dimensional structure of the semiconductor structure provided by the embodiments of the disclosure. As shown in FIG. 27, the word lines may be in a stepped shape and extend in the second direction. The capacitors extend in the first direction. The bit lines extend in the third direction. In addition, FIG. 27 illustrates a partial three-dimensional structure of the semiconductor structure. The substrate, the isolation structure and the like are not shown. In the embodiments of the disclosure, the first direction, the second direction and the third direction may be the directions perpendicular to one another. The three directions form a spatial rectangular coordinate system. In the spatial rectangular coordinate system, the first direction is a horizontal x-direction, the second direction is a horizontal y-direction, and the third direction is a vertical z-direction.

Figure 28:
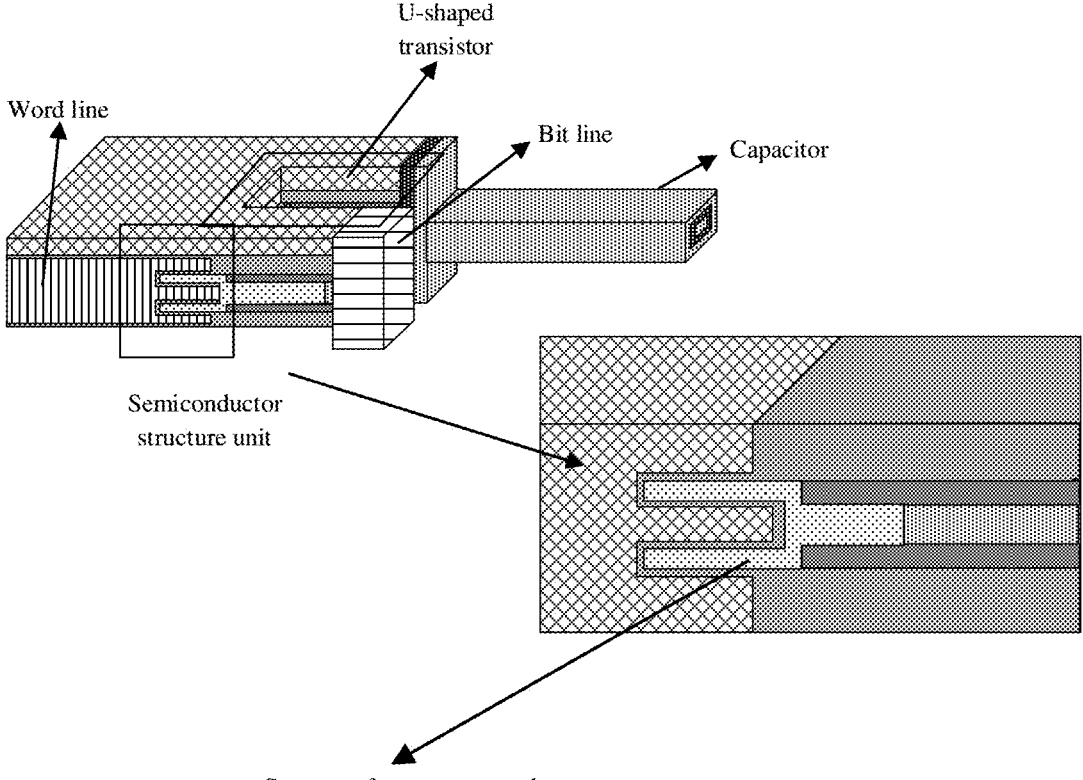
FIG. 28 illustrates a schematic diagram of a partial three-dimensional structure of the semiconductor structure provided by the embodiments of the disclosure.

FIG. 28 illustrates a schematic diagram of a partial three-dimensional structure of the semiconductor structure provided by the embodiments of the disclosure, which illustrates partial enlargement of a semiconductor structure unit in FIG. 27. As shown in FIG. 28, the semiconductor structure formed by the embodiments of the disclosure forms a U-shaped transistor. Moreover, a gate structure of the transistor is a seven-surface-gate-around structure. The channel structure has an upper channel layer and a lower channel area. In the U-shaped transistor, the first source-drain structure is connected to a capacitor. The first source-drain structure may be arranged to form a drain of the transistor. The second source-drain structure is connected to a bit line. The second source-drain structure may be arranged to form a source of the transistor. The gate structure is connected to the word line.

Further, FIGS. 29A and 29B illustrate top views of a semiconductor structure provided by the embodiments of the disclosure. As shown in FIGS. 29A and 29B, which illustrates a top view of multiple U-shaped transistors arranged at intervals, and word lines, bit lines, capacitors, and the like connected to the transistors (part structures are not shown). In the foregoing drawings, aa' corresponds to aa' in FIG. 29A, which is a section at the capacitor and the first source-drain structure. In the foregoing drawings, bb' corresponds to bb' in FIG. 29A, which is a section at the second source-drain structure and the bit line. FIG. 29B illustrates a position where an isolation structure is formed with a block. As shown in FIG. 29B, after the isolation structure is formed, the channel structures connected together will be disconnected to form multiple transistor structure independent of one another finally.

Further, in combination with FIGS. 29A and 29B, FIGS. 30A and 30B illustrate schematic diagrams of the arrangements of two semiconductor arrays. Two different array arrangement modes of the foregoing semiconductor structure units are shown. In FIG. 30A, the semiconductor structure units are arranged in sequence on the left side and the right side of the arrays. The capacitors on the left side and the right side are arranged alternately. In FIG. 30B, adjacent semiconductor structure arrays are distributed symmetrically on the left side and the right side of the arrays. These two layout arrangement modes can reduce the area of the layout, so that the integration degree of the semiconductor structure arrays is improved. In practice, the semiconductor structures may also be arranged in other modes. No specific limits are made thereto in the embodiments of the disclosure.

The embodiments of the disclosure provide a method for preparing a semiconductor structure, which includes that: a substrate is provided; a stack structure is formed on the substrate; the stack structure is divided into multiple channel areas, first source-drain areas and second source-drain areas by patterning the stack structure, each channel area is configured to extend in a second direction, each first source-drain area and each second source-drain area are configured to extend in a first direction, and the first source-drain area and the second source-drain area are located on a same side of the channel area; a first source-drain structure extending in the first direction is formed in the first source-drain area and a second source-drain structure extending in the first direction is formed in the second source-drain area; and a channel structure extending in the second direction is formed in the channel area, herein the first source-drain structure, the second source-drain structure and the channel structure form a transverse U-shaped transistor. Thus, in a stacked semiconductor structure, the transistor may consist of the channel structure, the first source-drain structure and the second source-drain structure. The channel structure extends in the first direction. The first source-drain structure and the second source-drain structure extend in the second direction. The three form the transverse U-shaped transistor, which is beneficial to improving the integration degree of the semiconductor structure, and reducing the area of the semiconductor structure. In addition, the channel of the transistor is of a dual channel structure in upper-lower horizontal arrangement, and the driving current intensity of the transistor can also be improved. A gate structure of the U-shaped transistor has a seven-surface-gate-around structure, which ensures the effective channel length of the transistor, and further improves the stability and the reliability of the transistor.

On the basis of the foregoing method for preparing a semiconductor structure, in another embodiment of the disclosure, a semiconductor structure is provided. As shown in FIGS. 26A-26E, the semiconductor structure may include:

a substrate 10;

a stack structure formed on the substrate 10, the stack structure includes multiple channel areas 101, first source-drain areas 102 and second source-drain areas 103, herein each channel area 101 extends in a second direction, each first source-drain area 102 and each second source-drain area 103 extend in a first direction, and the first source-drain area 102 and the second source-drain area 103 are located on a same side of the channel area 101;

a first source-drain structure 22 formed in the first source-drain area 102 and a second source-drain structure 23 formed in the second source-drain area 103, both the first source-drain structure 22 and the second source-drain structure 23 extend in the first direction; and a channel structure formed in channel area 101, the channel structure extends in the second direction.

It is to be noted that, FIG. 26E illustrates a top view of a semiconductor structure, FIG. 26A illustrates a sectional view taken along direction aa' in FIG. 26E, FIG. 26B illustrates a sectional view taken along direction bb' in FIG. 26E, FIG. 26C illustrates a sectional view taken along direction cc' in FIG. 26E, and FIG. 26D illustrates a sectional view taken along direction dd' in FIG. 26E. The first source-drain structure 22, the second source-drain structure 23 and the channel structure may form a transverse U-shaped transistor.

In some embodiments, in the channel area 101, the stack structure may include:

a substrate isolation layer 11; at least one stack layer 12 formed on the substrate isolation layer 11; a support layer 121 formed on the at least one stack layer 12, herein the stack layer 12 may include the further support layer 121, a first isolation layer 122, a gate structure, and a second isolation layer 126, herein the gate structure includes the channel structure, a gate dielectric layer formed on the surface of the channel structure, and a gate conductive layer formed on the surface of the gate dielectric layer.

In some embodiments, the materials of the first source-drain structure and the second source-drain structure may include at least one of the following: indium oxide, zinc oxide, indium zinc oxide, indium gallium oxide, indium gallium zinc oxide, indium zinc tin oxide, or zinc oxynitride.

In some embodiments, in the first source-drain area 102, the stack layer 12 includes the further support layer 121, the first isolation layer 122 formed on the further support layer 121, a first protective layer 123 formed on the first isolation layer 122, the first source-drain structure 22 formed on the first protective layer 123, a second protective layer 125 formed on the first source-drain structure 22, and the second isolation layer 126 formed on the second protective layer 125.

In the second source-drain area 103, the stack layer 12 includes the further support layer 121, the first isolation layer 122 formed on the further support layer 121, the first protective layer 123 formed on the first isolation layer 122, the second source-drain structure 23 formed on the first protective layer 123, the second protective layer 125 formed on the second source-drain structure 23, and the second isolation layer 126 formed on the second protective layer 125.

In some embodiments, the channel structure includes an upper channel layer 29, a lower channel layer 30, and a channel connecting layer 28.

In the first direction, the upper channel layer 29 is connected to the second protective layer 125. The lower channel layer 30 is connected to the first protective layer 123. The channel connecting layer 28 is formed between a terminal, connected to the second protective layer 125, of the upper channel layer 29 and a terminal, connected to the first protective layer 123, of the lower channel layer 30. The channel connecting layer 28 is connected to a terminal of the first source-drain structure 22 and a terminal of the second source-drain structure 23.

The materials of the substrate isolation layer, the first isolation layer, and the second isolation layer include silicon dioxide. The material of the support layer comprises silicon nitride. The materials of the first protective layer and the second protective layer include a low k material.

In some embodiments, the stack structure further includes multiple capacitor areas 104 and word line areas 105. Each capacitor area 104 extends in the first direction. The capacitor area 104 is connected to the first source-drain area 102. Each word line area 105 is located on a side, far away from the capacitor area 104, of the channel area 101. The word line area 105 is connected to the channel area 101.

In some embodiments, the semiconductor structure further includes multiple third isolation layers 33. Each third isolation layers 33 is formed on the surfaces of the channel structure, the first isolation layer 122, the second isolation layer 126, and the support layer 121. Part of the third isolation layer 33 formed in the channel area 101 forms a gate dielectric layer.

In the word line area 105, the stack layer 12 includes: the support layer 121, the third isolation layer 33, and a word line. The word line is formed between the third isolation layers 33.

It is to be noted that, as shown in FIG. 26A, the semiconductor structure further includes multiple second metal layer 34. Each second metal layer 34 is formed in a void between the third isolation layers 33 and completely fills the void between the third isolation layers 33. The part of the second metal layer 34 formed in the channel area 101 is used as a gate conductive layer of a transistor. The part of the second metal layer formed in the word line area 105 is used as a word line. The word lines may be in a stepped shape, which may refer to FIG. 27 specifically.

In some embodiments, the semiconductor structure may further include multiple support structures 15. The support structures 15 divide the stack structure into the channel areas 101, the first source-drain areas 102, and the second source-drain areas 103.

In some embodiments, the semiconductor structure further includes multiple first metal pillars 129 extending in the first direction. A part of each of the first metal pillars 129 that is formed between the first protective layer 123 and the second protective layer 125 in the first source-drain area 102 forms a first electrode structure and connects the first source-drain structure 22, and the other part of the first metal pillar 129 that is formed in the capacitor area 104 forms a lower electrode layer. A dielectric layer 17 is formed on the surface of the lower electrode layer. An upper electrode layer 18 is formed on the surface of the dielectric layer 17. A filling structure 19 is formed in voids of the upper electrode layer 18.

In some embodiments, the semiconductor structure further includes multiple bit lines 36 and second metal pillars 130.

Each bit line 36 extends in a third direction.

Each second metal pillar 130 extends in the first direction. A part of the second metal pillar 130 is formed between the first protective layer 123 and the second protective layer 125 located in the second source-drain area 103 and is connected to the second source-drain area 103; and the other part of the second metal pillar 130 is formed in the bit line 36.

In some embodiments, as shown in FIG. 26E, the gate conductive layer, the dielectric layer, and the channel structure form a gate structure. In the second direction, multiple gate structures are arranged. The semiconductor structure further includes multiple dividing structures 38. The dividing structures 38 divide the gate structures.

Details undisclosed in the embodiments of the disclosure may be understood with reference to the descriptions about the foregoing embodiments.

The embodiments of the disclosure provide a semiconductor structure, which includes: a substrate; a stack structure formed on the substrate, the stack structure including multiple channel areas, first source-drain areas and second source-drain areas, herein each channel area extends in a second direction, each first source-drain area and second source-drain area extend in a first direction, and the first source-drain area and the second source-drain area are located on the same side of the channel area; a first source-drain structure formed in the first source-drain area and a second source-drain structure formed in the second source-drain area, both the first source-drain structure and the second source-drain structure extend in the first direction; and a channel structure formed in the channel area, the channel structure extending in the second direction, herein the first source-drain structure, the second source-drain structure, and the channel structure form a transverse U-shaped transistor. Thus, in a stacked semiconductor structure, a transistor consists of a channel structure, and a first source-drain structure and a second source-drain that are located on the same side of the channel structure and both extend in the second direction; and the transistor, the first source-drain structure and the second source-drain form a transverse U-type transistor. This transistor structure is beneficial to improving the integration degree of the semiconductor structure, and reducing the area of the semiconductor structure.

In still another embodiment of the disclosure, reference is made to FIG. 31, which illustrates a schematic diagram of composition structures of a semiconductor memory provided by the embodiments of the disclosure. As shown in FIG. 31, the semiconductor memory 300 may include the semiconductor structure 200 as described in any one of the foregoing embodiments.

In some embodiments, the semiconductor memory is a 3D DRAM.

It is to be noted that the semiconductor memory 300 provided by the embodiments of the disclosure includes the semiconductor structure 200 as described in any one of the foregoing embodiments, which belongs to the application of a new material on a new structure. In this method and material application, it is possible to achieve a multi-stack of the 3D DRAM.

For the semiconductor memory 300, since it includes the semiconductor structure as described in the foregoing embodiments, the integration degree of the semiconductor memory 300 is improved, which is beneficial to the miniaturization of the semiconductor memory.

The above descriptions are only preferred embodiments of the disclosure and are not intended to limit the scope of protection of the disclosure.

It is to be noted that, herein, terms "comprise/include" and "contain" or any other variants thereof are intended to cover nonexclusive inclusions, so that a process, a method, an article, or an apparatus including a series of elements not only includes those elements but also includes other elements which are not clearly listed or further includes intrinsic elements of the process, the method, the article, or the apparatus. Under the condition of no more limitations, an element defined by a statement "including a/an . . . " does not exclude existence of additional same elements in the process, the method, or the apparatus.

The abovementioned sequence numbers of the embodiments of the disclosure are adopted not to represent superiority-inferiority of the embodiments but only for description.

The methods disclosed in some method embodiments provided in the disclosure may be freely combined without conflicts to obtain new method embodiments. The characteristics disclosed in several product embodiments provided in the disclosure may be freely combined without conflicts to obtain new product embodiments. The characteristics disclosed in several method or device embodiments provided in the disclosure may be freely combined without conflicts to obtain new method embodiments or device embodiments.

The abovementioned descriptions are only specific implementation modes of the disclosure, but the scope of protection of the disclosure is not limited thereto. Any variation or replacement readily figured out by a person skilled in the art within the technical scope disclosed in the disclosure shall fall within the scope of the protection of the disclosure.

Therefore, the scope of the protection of the disclosure shall be subject to the scope of protection of the claims.

INDUSTRIAL APPLICABILITY

Embodiments of the disclosure provide a method for preparing a semiconductor structure, a semiconductor structure and a semiconductor memory. The method includes that: a substrate is provided; a stack structure is formed on the substrate; the stack structure is divided into multiple channel areas, first source-drain areas and second source-drain areas by patterning the stack structure, herein each channel area extends in a second direction, each first source-drain area and each second source-drain area extend in a first direction, and the first source-drain area and the second source-drain area are located on the same side of the channel area; a first source-drain structure extending in the first direction is formed in the first source-drain area and a second source-drain structure extending in the first direction is formed in the second source-drain area; and a channel structure extending in the second direction is formed in the channel area. Thus, in a stacked semiconductor structure, a transistor consists of a channel structure, and a first source-drain structure and a second source-drain that are located on the same side of the channel structure and both extend in the second direction; and the transistor, the first source-drain structure, and the second source-drain form a transverse U-type transistor. This transistor structure is beneficial to improving the integration degree of the semiconductor structure, and reducing the area of the semiconductor structure.

The invention claimed is:

1. A semiconductor structure, comprising:
a substrate;
a stack structure formed on the substrate, wherein the stack structure comprises a plurality of channel areas, first source-drain areas and second source-drain areas, each channel area is configured to extend in a second direction, each first source-drain area and each second source-drain area are configured to extend in a first direction, and each first source-drain area and each second source-drain area are located on a same side of each channel area;
a first source-drain structure formed in each first source-drain area and a second source-drain structure formed in each second source-drain area, wherein both the first source-drain structure and the second source-drain structure are configured to extend in the first direction; and
wherein in each of the channel areas, the stack structure comprises:
a substrate isolation layer;
at least one stack layer formed on the substrate isolation layer; and
a support layer formed on the at least one stack layer
wherein each stack layer in each channel area comprises a further support layer, a first isolation layer, a gate structure, a channel structure and a second isolation layer, the gate structure comprises the channel structure, a gate dielectric layer formed on a surface of the channel structure, and a gate conductive layer formed on a surface of the gate dielectric layer.

2. The semiconductor structure of claim 1, wherein materials of the channel structure, the first source-drain structure, and the second source-drain structure comprises at least one of: indium oxide, zinc oxide, indium zinc oxide, indium gallium oxide, indium gallium zinc oxide, indium zinc tin oxide, or zinc oxynitride.

3. The semiconductor structure of claim 1, wherein each stack layer in each first source-drain area comprises the further support layer, the first isolation layer formed on the further support layer, a first protective layer formed on the first isolation layer, the first source-drain structure formed on the first protective layer, a second protective layer formed on the first source-drain structure, and the second isolation layer formed on the second protective layer; and
each stack layer in each second source-drain area comprises the further support layer, the first isolation layer formed on the further support layer, the first protective layer formed on the first isolation layer, the second source-drain structure formed on the first protective layer, the second protective layer formed on the second source-drain structure, and the second isolation layer formed on the second protective layer.

4. The semiconductor structure of claim 3, wherein the stack structure further comprises a plurality of capacitor areas and word line areas, each capacitor area is configured to extend in the first direction, and is connected to each first source-drain area, each word line area is located on a side, far away from each capacitor area, of each channel area, and is connected to each channel area.

5. The semiconductor structure of claim 4, wherein the semiconductor structure further comprises a plurality of third isolation layers, each third isolation layer is formed on surfaces of the channel structure, the first isolation layer, the second isolation layer, and the support layer;
a part of each third isolation layer formed in each channel area is configured as the gate dielectric layer;
each stack layer in each word line area comprises: the support layer, the third isolation layer and a word line; and
the word line is formed between adjacent third isolation layers and is connected to the gate structure,
wherein the semiconductor structure further comprises a plurality of support structures, the support structures are configured to divide the stack structure into the channel areas, the first source-drain areas and the second source-drain areas.

6. The semiconductor structure of claim 5, further comprising
a plurality of first metal pillars, wherein each first metal pillar is configured to extend in the first direction;
a part of each first metal pillar that is formed between the first protective layer and the second protective layer in each first source-drain area is configured as a first electrode structure and is connected to the first source-drain structure, and
the other part of each first metal pillar that is formed in the capacitor area is configured as a lower electrode layer, a dielectric layer is formed on a surface of the lower electrode layer, an upper electrode layer is formed on a surface of the dielectric layer; and a filling structure is formed in voids that are formed by the upper electrode layer.

7. The semiconductor structure of claim 6, further comprising
a plurality of bit lines and a plurality of second metal pillars, wherein
each bit line is configured to extend in a third direction; and
each second metal pillar is configured to extend in the first direction, a part of each second metal pillar is formed between the first protective layer and the second protective layer located in each second source-drain area and is connected to each second source-drain area, and the other part of each second metal pillar is formed in the bit line, wherein the gate conductive layer, the gate dielectric layer, and the channel structure form a gate structure, a plurality of gate structures are arranged in the second direction, the semiconductor structure further comprises a plurality of dividing structures, and the dividing structures are configured to isolate the gate structures.

\* \* \* \* \*